US008174031B2

(12) United States Patent
Kondoh

(10) Patent No.: US 8,174,031 B2
(45) Date of Patent: May 8, 2012

(54) LIGHT-EMITTING ELEMENT CHIP, EXPOSURE DEVICE AND IMAGE FORMING APPARATUS

(75) Inventor: Yoshinao Kondoh, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 624 days.

(21) Appl. No.: 12/364,668

(22) Filed: Feb. 3, 2009

(65) Prior Publication Data

US 2010/0038671 A1 Feb. 18, 2010

(30) Foreign Application Priority Data

Aug. 13, 2008 (JP) ................................ 2008-208785

(51) Int. Cl.
*H01L 27/15* (2006.01)

(52) U.S. Cl. ................ 257/82; 257/85; 257/88; 257/94; 257/115; 257/157; 257/E27.079; 257/E31.071

(58) Field of Classification Search .................... 257/82, 257/85, 88, 94, 115, 157, E27.079, E31.071
See application file for complete search history.

(56) References Cited

U.S. PATENT DOCUMENTS

| | | | | |
|---|---|---|---|---|
| 6,180,960 | B1 * | 1/2001 | Kusuda et al. | 257/91 |
| 6,498,356 | B1 * | 12/2002 | Sekiya et al. | 257/113 |
| 6,703,790 | B2 | 3/2004 | Ohno | |
| 7,122,834 | B2 | 10/2006 | Ogihara et al. | |
| 7,193,250 | B2 | 3/2007 | Ohno | |
| 7,518,152 | B2 | 4/2009 | Ohno | |
| 7,834,363 | B2 | 11/2010 | Ohno | |
| 2002/0134930 | A1 | 9/2002 | Ohno | |
| 2003/0090561 | A1 * | 5/2003 | Sekiya et al. | 347/237 |
| 2004/0130015 | A1 | 7/2004 | Ogihara et al. | |
| 2005/0224810 | A1 | 10/2005 | Ohno | |
| 2007/0057279 | A1 | 3/2007 | Ohno | |
| 2009/0166646 | A1 | 7/2009 | Ohno | |
| 2010/0026214 | A1 | 2/2010 | Nagumo | |

FOREIGN PATENT DOCUMENTS

| | | |
|---|---|---|
| JP | 9-097926 | 4/1997 |
| JP | 2001-219596 | 8/2001 |
| JP | 2001-287398 | 10/2001 |
| JP | 2003-249681 | 9/2003 |
| JP | 2004-207444 | 7/2004 |
| JP | 2005-259856 | 9/2005 |
| JP | 2005-271241 | 10/2005 |
| JP | 2007-268895 | 10/2007 |
| JP | 2007-273499 | 10/2007 |
| JP | 2010-040641 | 2/2010 |

* cited by examiner

*Primary Examiner* — Bac Au
(74) *Attorney, Agent, or Firm* — Fildes & Outland, P.C.

(57) ABSTRACT

The light-emitting element chip includes: a substrate; a light-emitting portion including plural light-emitting elements each having a first semiconductor layer that has a first conductivity type and that is stacked on the substrate, a second semiconductor layer that has a second conductivity type and that is stacked on the first semiconductor layer, the second conductivity type being a conductivity type different from the first conductivity type, a third semiconductor layer that has the first conductivity type and that is stacked on the second semiconductor layer, and a fourth semiconductor layer that has the second conductivity type and that is stacked on the third semiconductor layer; and a controller including a logical operation element that performs logical operation for causing the plural light-emitting elements to perform a light-emitting operation, the logical operation element being formed by combining some sequential layers of the first, second, third and fourth semiconductor layers.

5 Claims, 17 Drawing Sheets

FIG.10A
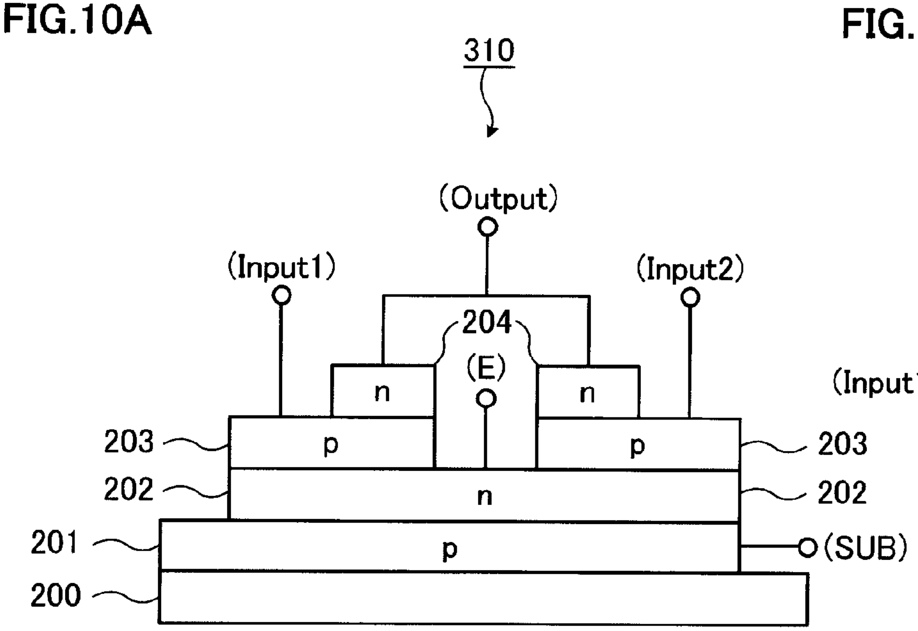
FIG.10B
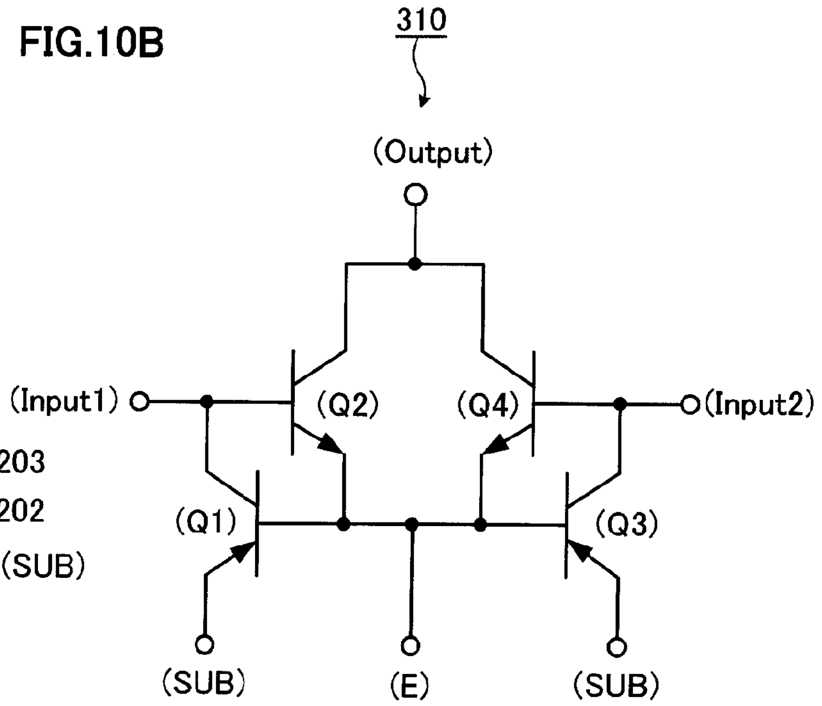
FIG.10C
| Input1 | Input2 | Output |
|---|---|---|
| L | L | H |
| L | H | L |
| H | L | L |
| H | H | L |

FIG.17A
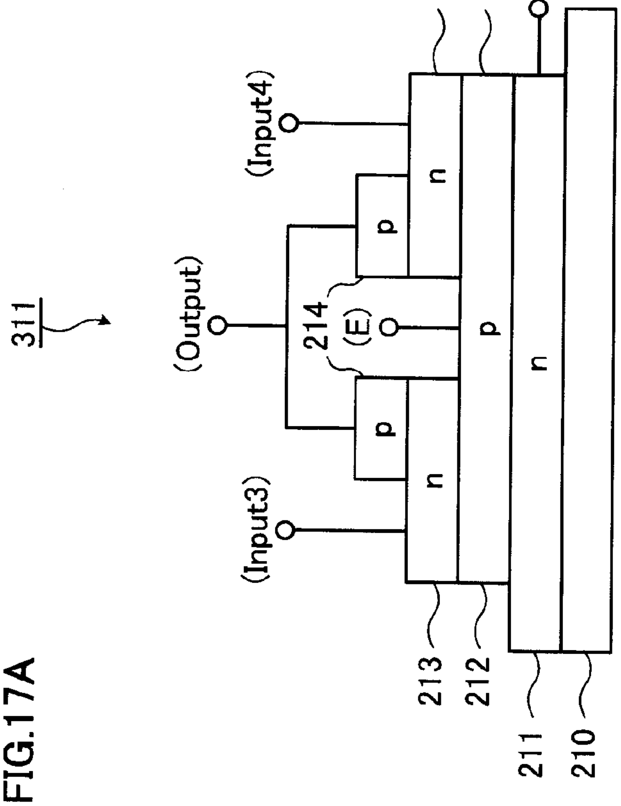
FIG.17B
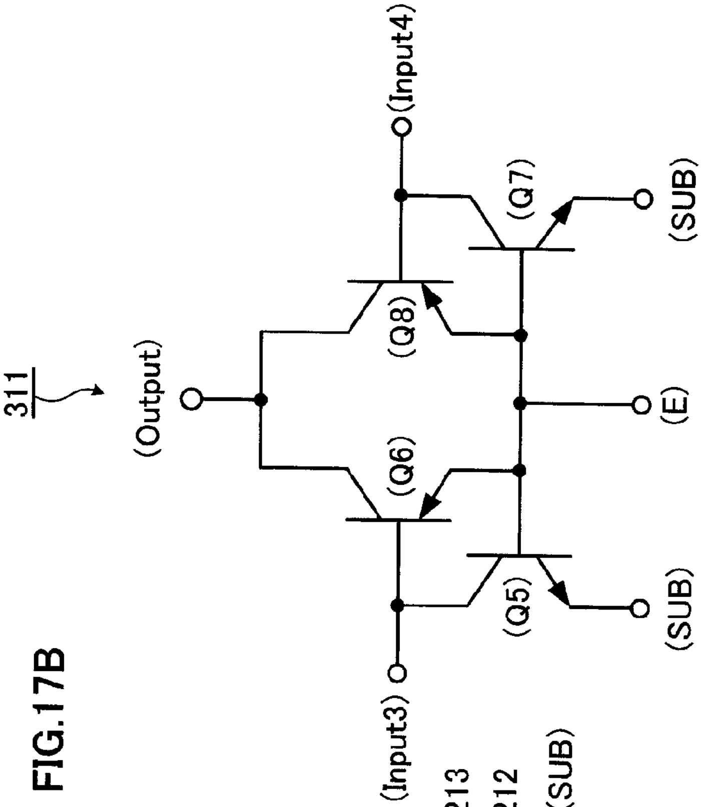
FIG.17C
| Input3 | Input4 | Output |
|---|---|---|
| L | L | H |
| L | H | H |
| H | L | H |
| H | H | L |

LIGHT-EMITTING ELEMENT CHIP, EXPOSURE DEVICE AND IMAGE FORMING APPARATUS

CROSS REFERENCE TO RELATED APPLICATIONS

This application is based on and claims priority under 35 USC §119 from Japanese Patent Application No. 2008-208785 filed Aug. 13, 2008.

BACKGROUND

1. Technical Field

The present invention relates to a light-emitting element chip, an exposure device and an image forming apparatus.

2. Related Art

In an electrophotographic image forming apparatus such as a printer, a copy machine or a facsimile machine, an image is formed on a recording paper sheet as follows. Firstly, an electrostatic latent image is formed on a uniformly charged photoconductor by causing an optical recording unit to emit light so as to transfer image information onto the photoconductor. Then, the electrostatic latent image is made visible by being developed with toner. Lastly, the toner image is transferred on and fixed to the recording paper sheet. As such an optical recording unit, in addition to an optical-scanning recording unit that performs exposure by laser scanning in a fast scan direction using a laser beam, an optical recording unit using the following exposure device has been employed in recent years. This exposure device includes a large number of light-emitting element chips arrayed in a fast scan direction, and each light-emitting element chip includes a light-emitting element array formed of one-dimensionally arrayed light-emitting elements such as light emitting diodes (LEDs).

SUMMARY

According to an aspect of the present invention, there is provided a light-emitting element chip including: a substrate; a light-emitting portion including plural light-emitting elements each having a first semiconductor layer that has a first conductivity type and that is stacked on the substrate, a second semiconductor layer that has a second conductivity type and that is stacked on the first semiconductor layer, the second conductivity type being a conductivity type different from the first conductivity type, a third semiconductor layer that has the first conductivity type and that is stacked on the second semiconductor layer, and a fourth semiconductor layer that has the second conductivity type and that is stacked on the third semiconductor layer; and a controller including a logical operation element that performs logical operation for causing the plural light-emitting elements of the light-emitting portion to perform a light-emitting operation, the logical operation element being formed by combining some sequential layers of the first semiconductor layer stacked on the substrate, the second semiconductor layer stacked on the first semiconductor layer, the third semiconductor layer stacked on the second semiconductor layer, and the fourth semiconductor layer stacked on the third semiconductor layer.

BRIEF DESCRIPTION OF THE DRAWINGS

Exemplary embodiment (s) of the present invention will be described in detail based on the following figures, wherein:

FIGS. 10A to 10C each show a NOR circuit having a pnpn structure;

FIGS. 17A to 17C each show a NAND circuit having an npnp structure.

DETAILED DESCRIPTION

Hereinafter, a description will be given of exemplary embodiments of the present invention. Note that the present invention is not limited to the following exemplary embodiments, but may be implemented in various modified forms within the gist of the present invention. In addition, the drawings referred to herein are not to show actual sizes but are used to illustrate the exemplary embodiments.

Figure 1:
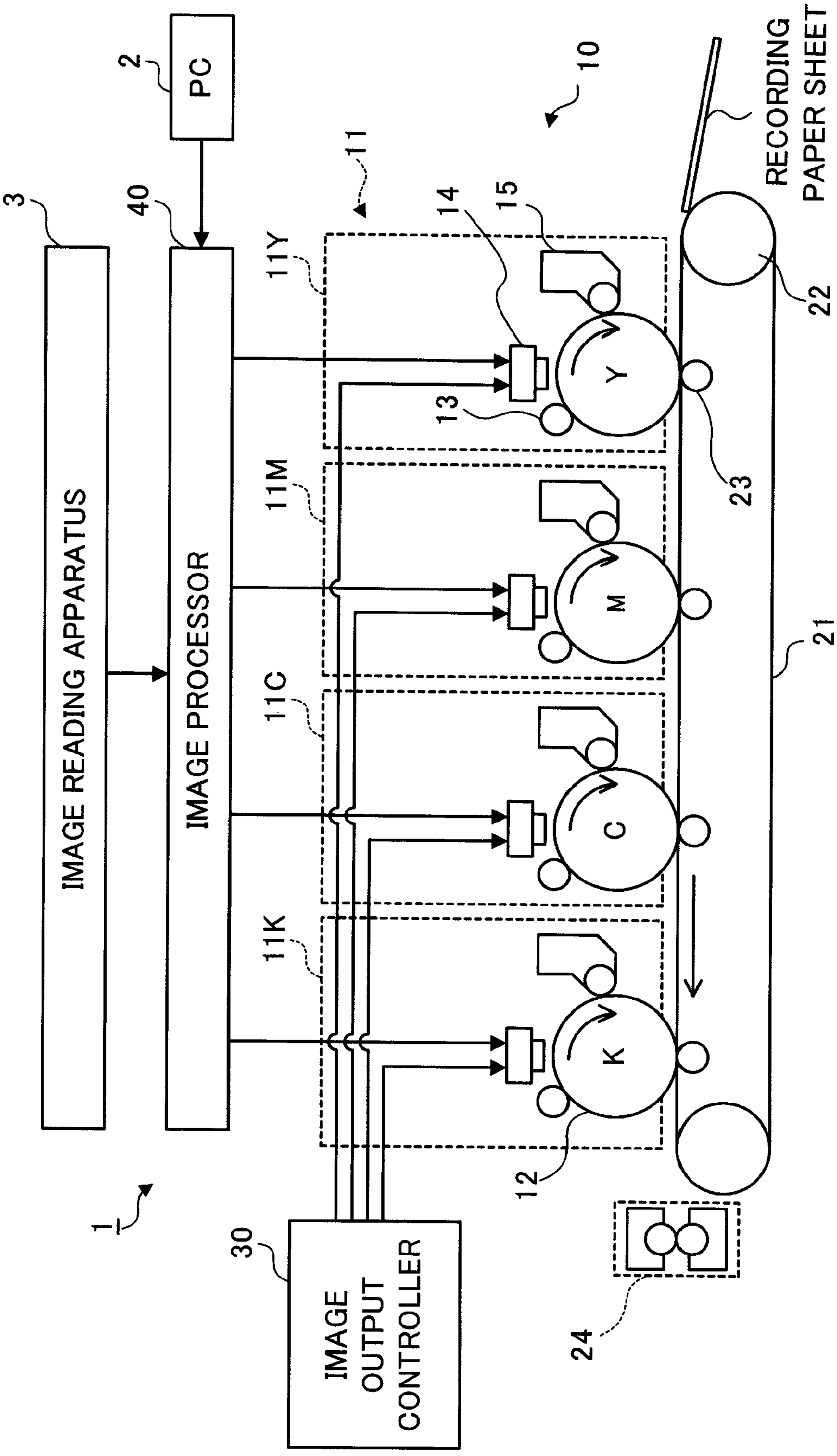
FIG. 1 shows an overall configuration of an image forming apparatus to which the exemplary embodiments are to be applied.

FIG. 1 shows an overall configuration of an image forming apparatus 1 to which the exemplary embodiments are to be applied.

The image forming apparatus 1 shown in FIG. 1 includes an image formation processing system 10, an image output controller 30 and an image processor 40. The image formation processing system 10 forms an image in accordance with different color tone data sets. The image output controller 30 controls the image formation processing system 10. The image processor 40, which is connected to devices such as a personal computer (PC) 2 and an image reading apparatus 3, performs predefined image processing on image data received from the above devices.

The image formation processing system 10 includes image forming units 11. The image forming units 11 are formed of multiple engines placed in parallel at intervals in the horizontal direction. Specifically, the image forming units 11 are composed of four units: a yellow (Y) image forming unit 11Y, a magenta (M) image forming unit 11M, a cyan (C) image forming unit 11C and a black (K) image forming unit 11K. Each image forming unit 11 includes a photoconductive drum 12, a charging device 13, an exposure device 14 and a developing device 15. On the photoconductive drum 12 as an example of an image carrier (photoconductor), an electrostatic latent image is formed and thus a toner image is formed. The charging device 13 as an example of a charging unit charges the outer surface of the photoconductive drum 12. The exposure device 14 as an example of an exposure unit exposes the photoconductive drum 12 charged by the charging device 13. The developing device 15 as an example of a developing unit develops a latent image formed by the exposure device 14. In addition, the image formation processing system 10 further includes a paper sheet transport belt 21, a drive roll 22 and transfer rolls 23. The paper sheet transport belt 21 transports a recording paper sheet so that color toner images respectively formed on the photoconductive drums 12 of the image forming units 11Y, 11M, 11C and 11K are transferred on the recording paper sheet by multilayer transfer. The drive roll 22 drives the paper sheet transport belt 21. Each transfer roll 23 as an example of a transfer unit transfers the toner image formed on the corresponding photoconductive drum 12 onto a recording paper sheet, which is a transfer-target medium.

Upon receipt of image data from the PC 2 and the image reading apparatus 3, the image processor 40 performs image processing on the image data and supplies the resultant data, as image signals, to the image forming units 11Y, 11M, 11C and 11K through an interface. The image formation processing system 10 operates on the basis of a synchronizing signal and the like supplied by the image output controller 30. For example, in the yellow image forming unit 11Y, on the basis of image signals supplied from the image processor 40, the exposure device 14 forms an electrostatic latent image on the outer surface of the photoconductive drum 12 charged by the charging device 13. Then, the developing device 15 forms a yellow toner image from the formed electrostatic latent image. By using the corresponding transfer roll 23, the yellow image forming unit 11Y transfers the formed yellow toner image on a recording paper sheet while the recording paper sheet is transported on the paper sheet transport belt 21 that rotates in the direction indicated by an arrow in FIG. 1. Then, magenta, cyan and black toner images are respectively formed on the photoconductive drums 12 dedicated thereto. After that, by using the corresponding transfer rolls 23, these color toner images are transferred by multilayer transfer on the recording paper sheet transported on the paper sheet transport belt 21. Then, the recording paper sheet is transported to a fixing device 24, which heats and presses to fix the toner images transferred by multilayer transfer on the recording paper sheet.

Figure 2:
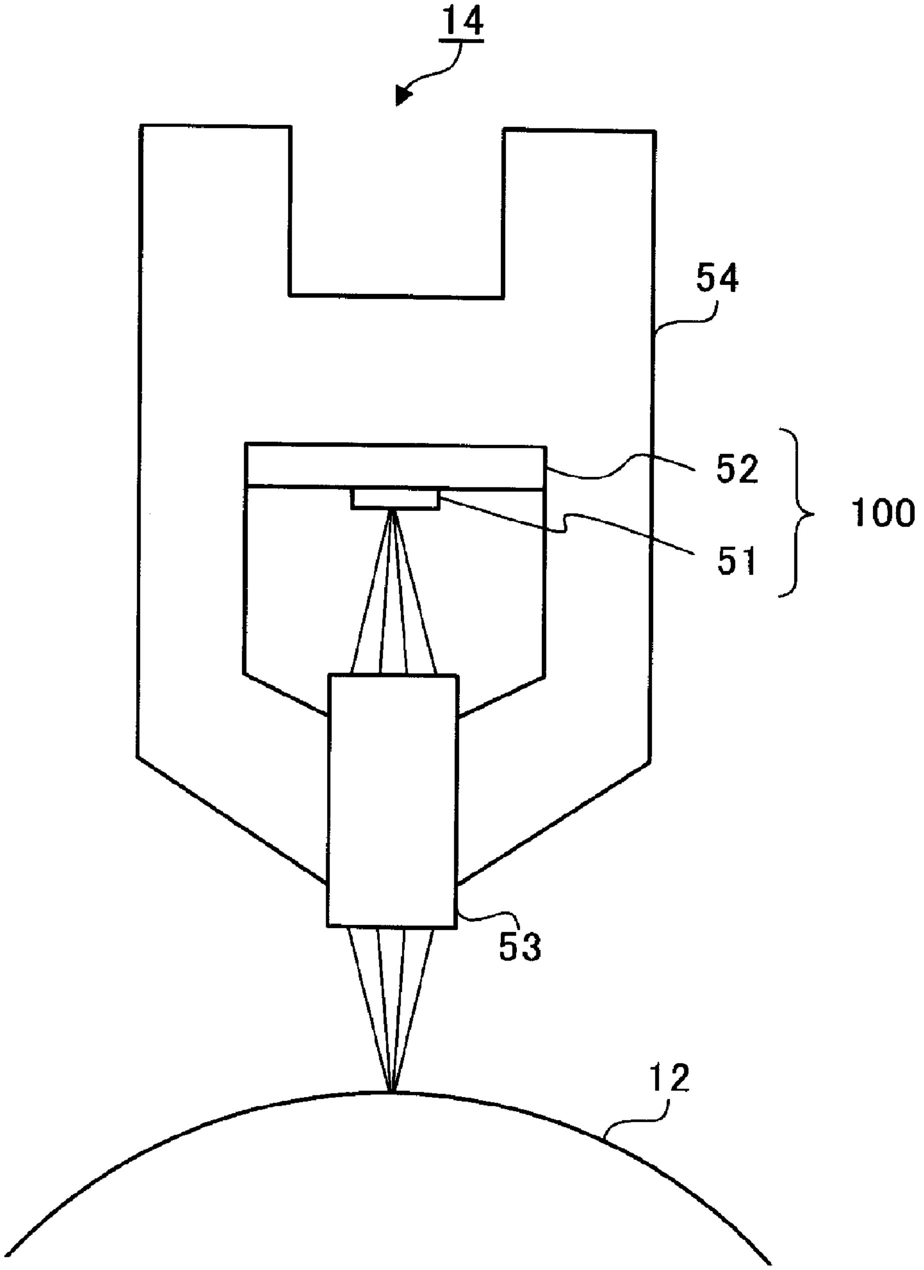
FIG. 2 shows a structure of the exposure device to which the exemplary embodiments are to be applied.

FIG. 2 shows a structure of the exposure device 14 to which the exemplary embodiments are to be applied. The exposure device 14 includes light-emitting element chips 51, a printed circuit board 52 and a rod lens array 53. Each light-emitting element chip 51 includes a one-dimensional array of multiple light-emitting elements. The printed circuit board 52 supports the light-emitting element chips 51. In addition, a circuit that performs drive control on the light-emitting element chips 51 is mounted on the printed circuit board 52. The rod lens array 53, which is an optical element, focuses a light output emitted by the light-emitting elements onto the outer surface of the photoconductive drum 12. The printed circuit board 52 and the rod lens array 53 are held by a housing 54. On the printed circuit board 52, multiple light-emitting element chips 51 are supported so that as many light-emitting elements as correspond to the intended number of pixels are arrayed in the fast scan direction. For example, suppose the case where the shorter side (297 mm) of an A3-size recording paper sheet is set as a fast scan direction, and where the output resolution is 600 dpi. In this case, 7040 light-emitting elements may be arrayed on the printed circuit board 52 at intervals of 42.3 μm. Note that, actually in the exemplary embodiments, 7680 light-emitting elements are arrayed on the printed circuit board 52 in consideration of side-to-side misregistration and the like. Hereinbelow, the light-emitting element chips 51 and the printed circuit board 52 will be collectively referred to as a light-emitting element head 100.

Figure 3:
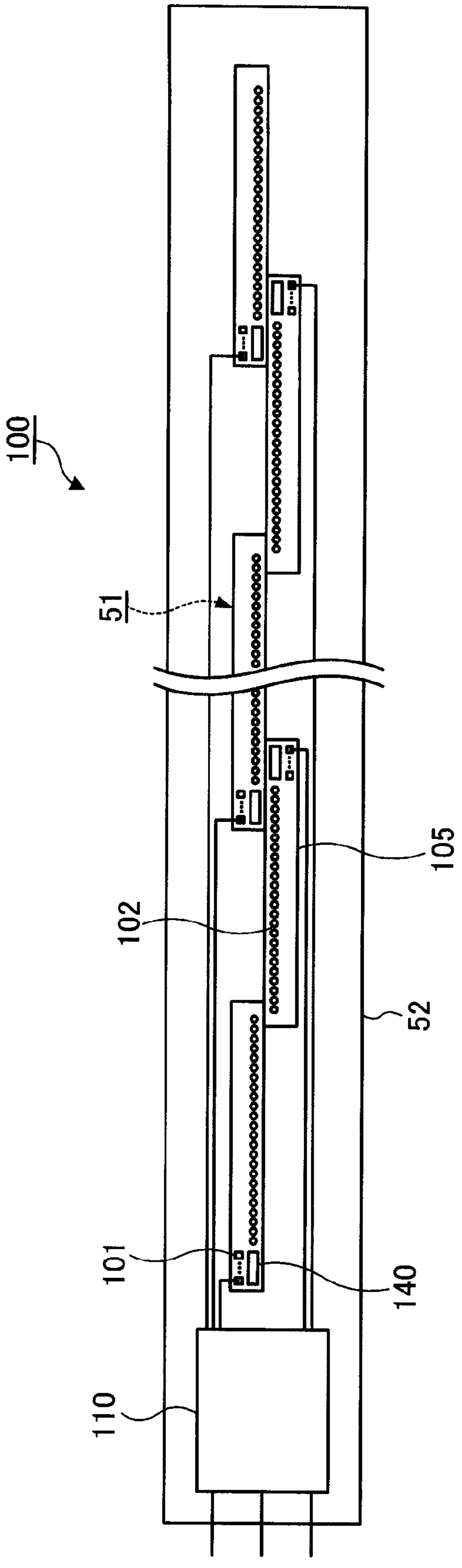
FIG. 3 shows a structure of the light-emitting element head.

FIG. 3 shows a structure of the light-emitting element head 100. The light-emitting element head 100 includes the printed circuit board 52, the multiple light-emitting element chips 51 and a signal generating circuit 110. The light-emitting element chips 51 are zigzag arrayed in the fast scan direction. The signal generating circuit 110 supplies control signals for causing the light-emitting elements 102 of the light-emitting element chips 51 to emit light. The signal generating circuit 110 may be an LSI such as an application specific integrated circuit (ASIC), for example.

Each light-emitting element chip 51 includes a substrate 105, the light-emitting elements 102, bonding pads 101 and a controller 140. The substrate 105 is rectangular, and the light-emitting elements 102 are arrayed on the substrate 105 at equal intervals in a line along a longer side thereof.

The light-emitting element chips 51 are arrayed on the printed circuit board 52 so as to have an overlapping portion between each of the odd-numbered light-emitting element chips 51 and adjacent one of the even-numbered light-emitting element chips 51 which are faced each other. Here, the overlapping portion of each light-emitting element chip 51 includes the bonding pads 101 and the controller 140. Thereby, the light-emitting elements 102 on the multiple light-emitting element chips 51 are arrayed at equal intervals on the printed circuit board 52.

From signals including image signals supplied by the image processor 40 and the synchronizing signal supplied by the image output controller 30, which are provided in the image forming apparatus 1 (see FIG. 1), the signal generating circuit 110 generates the control signals for causing the light-emitting elements 102 of the light-emitting element chips 51 to perform a light-emitting operation.

Generally, in an exposure device using a self-scanning light-emitting element array formed of GaAs light-emitting thyristors each having a pnpn structure or an npnp structure, a number of light-emitting element chips each having a one-dimensional light-emitting element array formed thereon are zigzag arrayed. The control signals for driving the light-emitting element arrays include: a clock signal for causing the light-emitting elements to sequentially emit light by self-scanning; and lighting signals for specifying whether the light-emitting elements are to emit light or not on a single element basis.

Unlike the clock signal, which is shared by the multiple light-emitting element chips on the light-emitting element head, the different lighting signals are provided to the respective light-emitting element chips. Accordingly, this type of exposure device uses as many lighting signal lines as the light-emitting element chips on the light-emitting element head.

As a result, the number of signal lines increases with increase in the number of light-emitting element chips, which complicates the routing of the signal lines among the zigzag arrayed light-emitting element chips.

However, if each light-emitting element chip is capable of selecting which one of the lighting signals to receive and capable of receiving the selected lighting signal, the exposure device is allowed to employ a lighting signal multiplexed for multiple light-emitting element chips. This will reduce the number of signal lines and thus simplifies the routing of the signal lines among the light-emitting element chips.

To this end, each light-emitting element chip needs to be provided with a logical operation circuit that selects which one of the lighting signals to receive. In other words, for example, each light-emitting element chip maybe provided with a chip selector and identification information identifying the light-emitting element chip is assigned to each light-emitting element chip. In addition, the light-emitting element chip may receive a lighting signal when identification information included in a chip select signal cs received by the chip selector matches the identification information of the light-emitting element chip.

Figure 4:
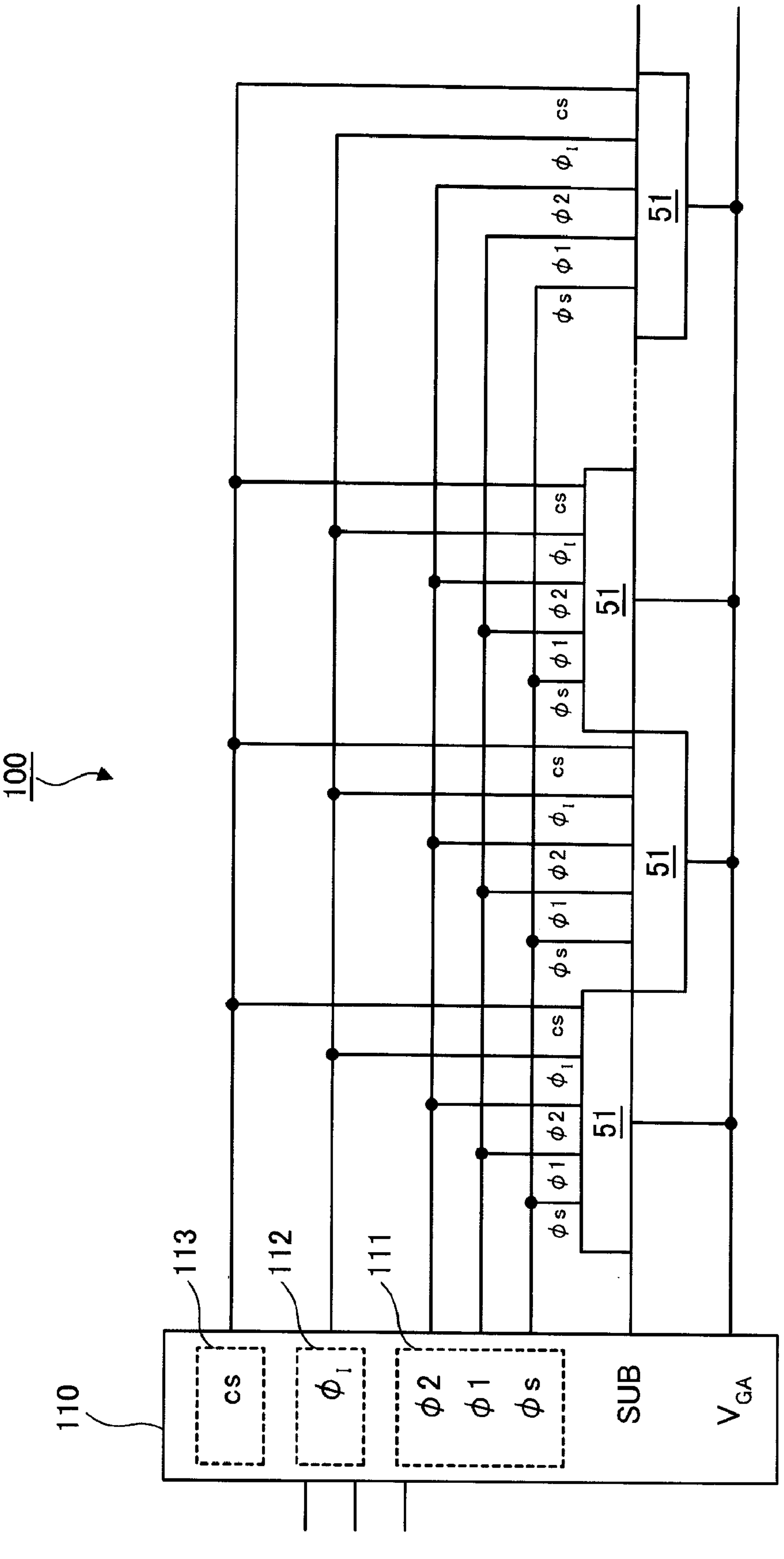
FIG. 4 is a diagram for illustrating an example of signals that the signal generating circuit supplies to the light-emitting element chips in the light-emitting element head.

FIG. 4 is a diagram for illustrating an example of signals that the signal generating circuit 110 supplies to the light-emitting element chips 51 in the light-emitting element head 100. The signal generating circuit 110 includes a transfer signal generating unit 111, a lighting signal generating unit 112 and a select signal generating unit 113. The transfer signal generating unit 111 generates a start signal ϕs and clock signals ϕ1 and ϕ2. The lighting signal generating unit 112 generates a lighting signal $\phi_I$ for controlling the light-emitting operation (emitting light or not) of the light-emitting elements 102. The select signal generating unit 113 generates the chip select signal cs for selecting a light-emitting element chip 51 to emit light from the multiple light-emitting element chips 51. In addition, the signal generating circuit 110 provides a power supply $V_{GA}$ and a reference potential (SUB) for the light-emitting element chips 51.

The start signal ϕs and the clock signals ϕ1 and ϕ2 are shared by the multiple light-emitting element chips 51 on the light-emitting element head 100. In addition, the lighting signal $\phi_I$ and the chip select signal cs are also shared by the multiple light-emitting element chips 51 on the light-emitting element head 100 in the exemplary embodiments. In other words, the signals including the start signal ϕs, the clock signals ϕ1 and ϕ2, and the lighting signal $\phi_I$ are supplied even to the light-emitting element chips 51 other than those selected as light-emitting targets.

Figure 5:
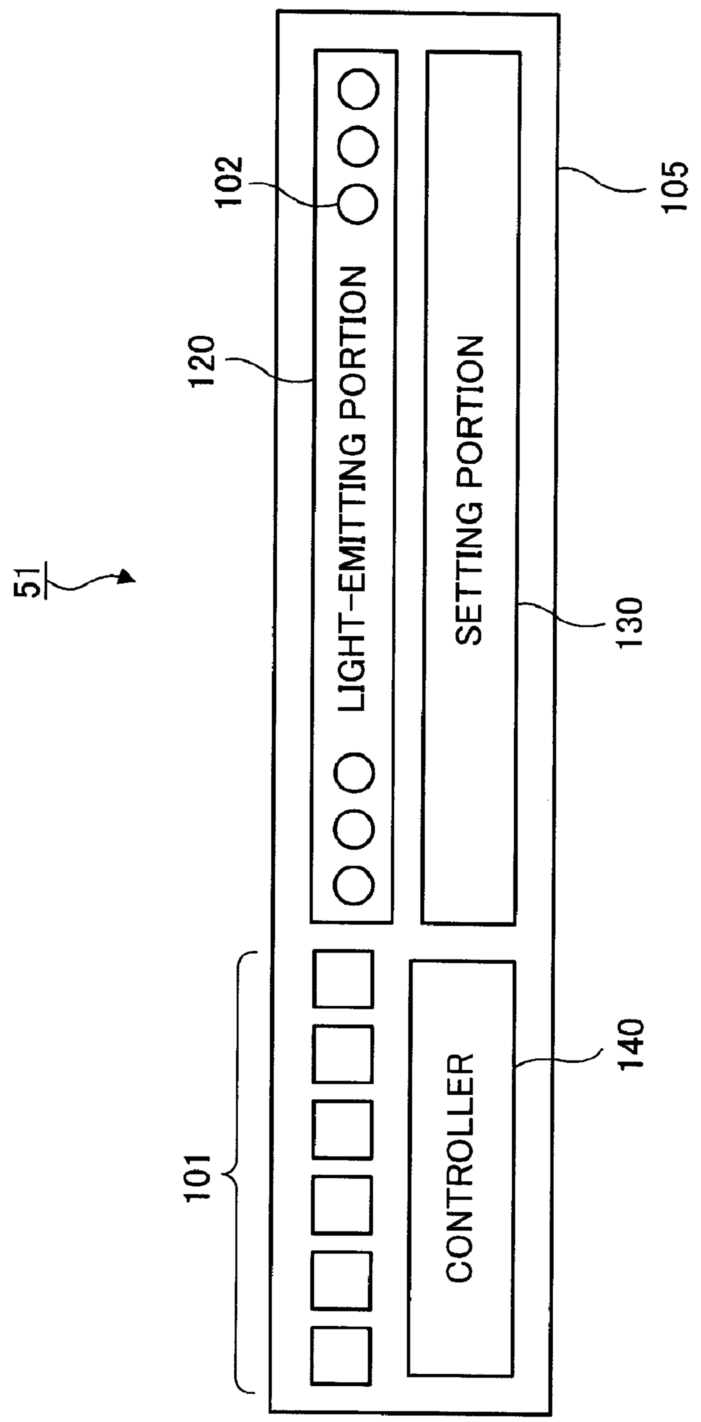
FIG. 5 shows a configuration of each light-emitting element chip.

FIG. 5 shows a configuration of each light-emitting element chip 51 of the exemplary embodiments.

The light-emitting element chip 51 includes, on the substrate 105, a light-emitting portion 120, a setting portion 130, the controller 140 and the bonding pads 101. The light-emitting portion 120 includes light-emitting elements 102 arrayed at equal intervals, while the setting portion 130 causes the light-emitting elements 102 to sequentially emit light.

Hereinafter, a description will be given of a first exemplary embodiment of the light-emitting element chip 51.

Figure 6:
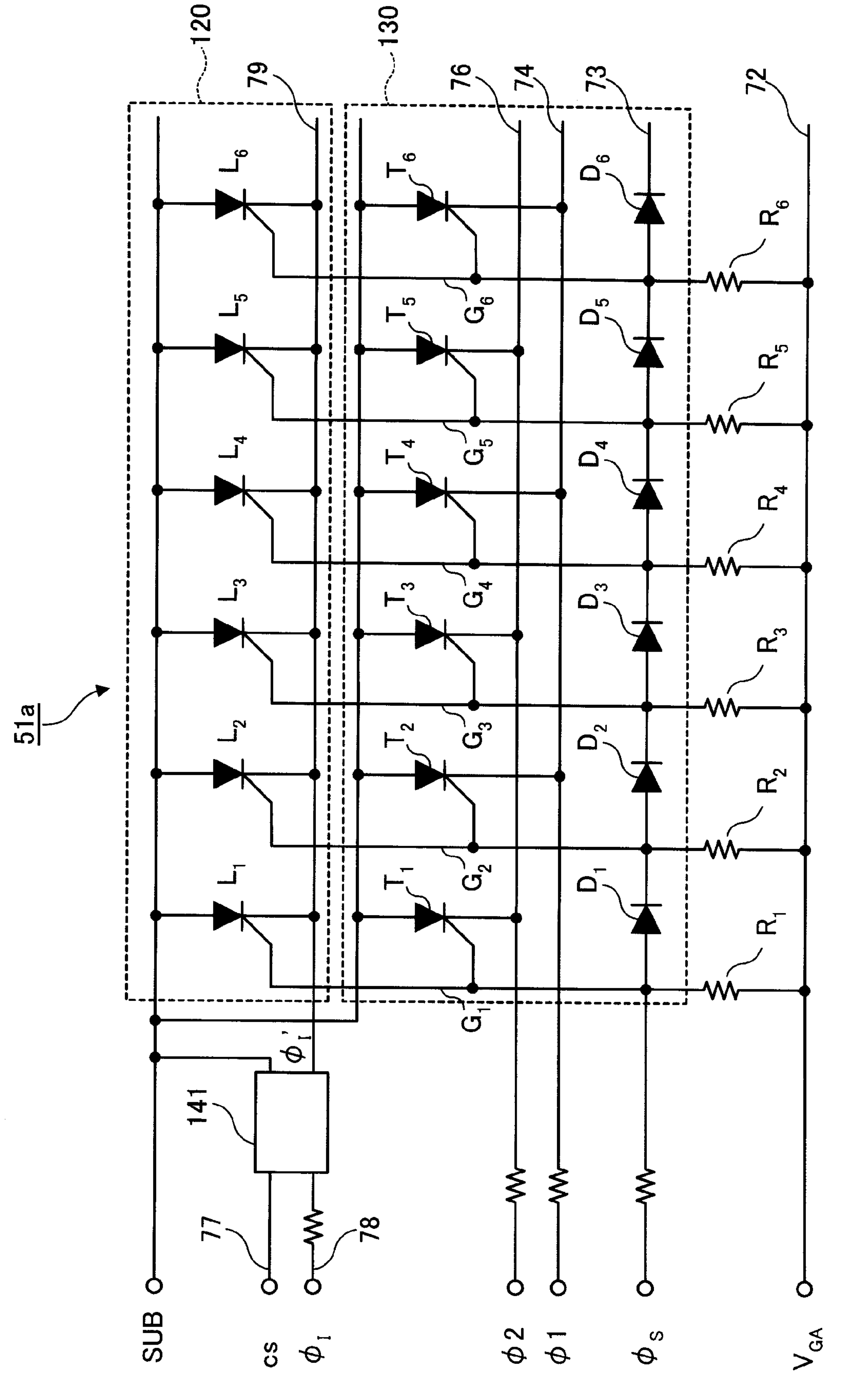
FIG. 6 shows an equivalent circuit of a light-emitting element chip using a self-scanning light-emitting element array of the first exemplary embodiment.

FIG. 6 shows an equivalent circuit of a light-emitting element chip 51*a* using a self-scanning light-emitting element array of the first exemplary embodiment. The self-scanning light-emitting element array includes a light-emitting portion 120 and a setting portion 130 separated from each other. To be more precise, the self-scanning light-emitting element array includes the light-emitting portion 120, the setting portion 130 and a chip selector 141. The light-emitting portion 120 includes light-emitting thyristors $L_1$, $L_2$, $L_3$, . . . , as the light-emitting elements 102. The setting portion 130 includes transfer thyristors $T_1$, $T_2$, $T_3$, . . . , serving as setting elements, and connecting diodes $D_1$, $D_2$, $D_3$, . . . . The chip selector 141 is an example of a controller. The light-emitting thyristors $L_1$, $L_2$, $L_3$, . . . , are one-dimensionally arrayed while the transfer thyristors $T_1$, $T_2$, $T_3$, . . . , are also one-dimensionally arrayed.

The power supply $V_{GA}$ (assumed here to be −3.3 V) is connected to gate electrodes $G_1$, $G_2$, $G_3$, . . . , of the transfer thyristors $T_1$, $T_2$, $T_3$, . . . , through a power supply line 72 and then load resistors $R_1$, $R_2$, $R_3$, . . . , respectively. In addition, the gate electrodes $G_1$, $G_2$, $G_3$, . . . , of the transfer thyristors $T_1$, $T_2$, $T_3$, . . . , are connected to gate electrodes $G_1$, $G_2$, $G_3$, . . . , of the light-emitting thyristors $L_1$, $L_2$, $L_3$, . . . , respectively. Here, each of the gate electrodes of the transfer thyristors $T_1$, $T_2$, $T_3$, . . . , and the corresponding one of the gate electrodes of the light-emitting thyristors $L_1$, $L_2$, $L_3$, . . . , are regarded not as separate gate electrodes but as a common gate electrode, and thus collectively referred to as gate electrode $G_1$, $G_2$, $G_3$, . . . .

The gate electrode $G_1$ of the transfer thyristor $T_1$, to which a start signal (ϕs) line 73 is connected, is supplied with the start signal ϕs.

An anode electrode of each of the light-emitting thyristors $L_1$, $L_2$, $L_3$, . . . , and the transfer thyristors $T_1$, $T_2$, $T_3$, . . . , is connected to the reference potential (SUB) (assumed here to be 0 V). The cathode electrodes of the transfer thyristors $T_1$, $T_2$, $T_3$, . . . , are alternately connected to clock signal (ϕ1 and ϕ2) lines 74 and 76, and thus supplied with the clock signals ϕ1 and ϕ2.

The chip selector 141 is connected to a chip select signal line 77, an input-side lighting signal line 78 and the reference potential SUB. In addition, the chip selector 141 is also connected to the cathode electrodes of the light-emitting thyristors $L_1$, $L_2$, $L_3$, . . . , through an output-side lighting signal line 79.

Upon receipt of the chip select signal cs, the chip selector 141 performs either of the following operations. First, suppose the case where identification information inputted as the chip select signal cs matches unique identification information (ID) of the light-emitting element chip 51*a* on which the chip selector 141 is mounted. In this case, the chip selector 141 judges that this light-emitting element chip 51*a* is selected, and thus supplies the light-emitting portion 120 with a lighting signal $\phi_I'$ corresponding to the inputted lighting signal $\phi_I$. By contrast, suppose the case where the identification information inputted as the chip select signal cs does not match the unique identification information (ID) of the light-emitting element chip 51*a* on which the chip selector 141 is mounted. In this case, the chip selector 141 judges that this light-emitting element chip 51*a* is not selected, and thus supplies the light-emitting portion 120 with no lighting signal $\phi_I'$.

This function allows only the light-emitting element chips 51*a* judged as selected chips by their respective chip selectors 141 to receive the lighting signal $\phi_I$ even if the signals including the lighting signal $\phi_I$ are simultaneously supplied to all the light-emitting element chips 51*a* on the light-emitting element head 100.

Note that the operations of the chip selector 141 will be described in detail later.

Here, a brief description will be given of operations of the light-emitting portion 120 and the setting portion 130. Firstly, the operation of the setting portion 130 will be described. Assume here that the power Supply $V_{GA}$ of −3.3 V is an L level and the reference potential (SUB) of 0 V is an H level.

The start signal ϕs is a signal for bringing the setting portion 130 into operation. An ON-state voltage of each transfer thyristor is approximated by an electronic potential of its gate electrode plus a diffusion potential (assumed here to be 1

V) of a pn junction. When the start signal ϕs is set to the H level (0 V), the electronic potential of the gate electrode $G_1$ becomes 0 V, and thus the ON-state voltage of the transfer thyristor $T_1$ becomes −1 V. When the clock signal ϕ2 is set to the L level under the above condition, the transfer thyristor $T_1$ is turned on. Shortly thereafter, the start signal ϕs is set back to the L level.

When the transfer thyristor $T_1$ is turned on, the electronic potential of the gate electrode $G_1$ rises from the $V_{GA}$ of −3.3 V to approximately the SUB of 0 V. The effect of this electronic potential rise is transmitted to the gate electrode $G_2$ through the connecting diode $D_1$, and sets the electronic potential of the gate electrode $G_2$ to −1 V (a value obtained by subtracting a forward rising voltage (equal to a diffusion potential) of the connecting diode $D_1$ from the SUB). As a result, the ON-state voltage of the transfer thyristor $T_2$ becomes −2 V. Thus, when the clock signal ϕ1 is set to have an electronic potential lower than −2 V, the transfer thyristor $T_2$ is turned on. If the clock signal ϕ2 is subsequently set back to the H level of 0 V, the transfer thyristor $T_1$ is turned off, and the electronic potential of the gate electrode $G_1$ becomes the L level of −3.3 V.

When the transfer thyristor $T_2$ is turned on, the electronic potential of the gate electrode $G_2$ rises from −1 V to approximately the SUB of 0 V. The effect of this electronic potential rise is transmitted to the gate electrode $G_3$ through the connecting diode $D_2$, and sets the electronic potential of the gate electrode $G_3$ to −1 V, and the ON-state voltage of the transfer thyristor $T_3$ to −2 V.

Meanwhile, since the connecting diode $D_1$ is reversely biased, the aforementioned effect of the electronic potential rise is not transmitted to the gate electrode $G_1$. Thus, the electronic potential of the gate electrode $G_1$ remains −3.3 V while the ON-state voltage of the transfer thyristor $T_1$ remains −4.3 V.

When the clock signal ϕ2 is set to have an electronic potential between −2 V and −4.3 V under this condition, the transfer thyristor $T_3$ is turned on while the transfer thyristors other than the transfer thyristors $T_2$ and $T_3$ are kept turned off.

By repeating the above operations of controlling the clock signals ϕ1 and ϕ2, the transfer thyristors are sequentially turned on.

Secondly, the operation of the light-emitting portion 120 will be described. Now, if the transfer thyristor $T_1$ is turned on, then the electronic potential of the gate electrode $G_1$ rises from the $V_{GA}$ of −3.3 V to approximately the SUB of 0 V. Incidentally, the ON-state voltage of each light-emitting thyristor is approximated by the electronic potential of its gate electrode plus the diffusion potential (assumed here to be 1 V) of the pn junction. Accordingly, the ON-state voltage of the light-emitting thyristor $L_1$ becomes −1 V.

Meanwhile, the ON-state voltage of the light-emitting thyristor $L_2$ is −2 V and the ON-state voltage of each of the other light-emitting thyristors $L_3$, $L_4$, $L_5$, . . . , is −3 V or less because of additional connecting diodes. Accordingly, if the lighting signal $\phi_I$ is set to have an electronic potential between −1 V and −2 V, only the light-emitting thyristor $L_1$ is turned on while the other light-emitting thyristors $L_2$, $L_3$, $L_4$, . . . , are kept turned off.

Note that the turned-on light-emitting thyristor $L_1$ is turned off by setting the lighting signal $\phi_I$ to the H level of 0 V.

Light-emission intensities of the respective light-emitting thyristors $L_1$, $L_2$, $L_3$, . . . , are determined by any one of an amount of current flowing in the lighting signal $\phi_I$ line and the width of the lighting signal $\phi_I$. In addition, even if a certain transfer thyristor is turned on, if the lighting signal $\phi_I$ remains set to the H level of 0 V, the light-emitting thyristor corresponding to the certain transfer thyristor continues to emit no light.

Figure 7:
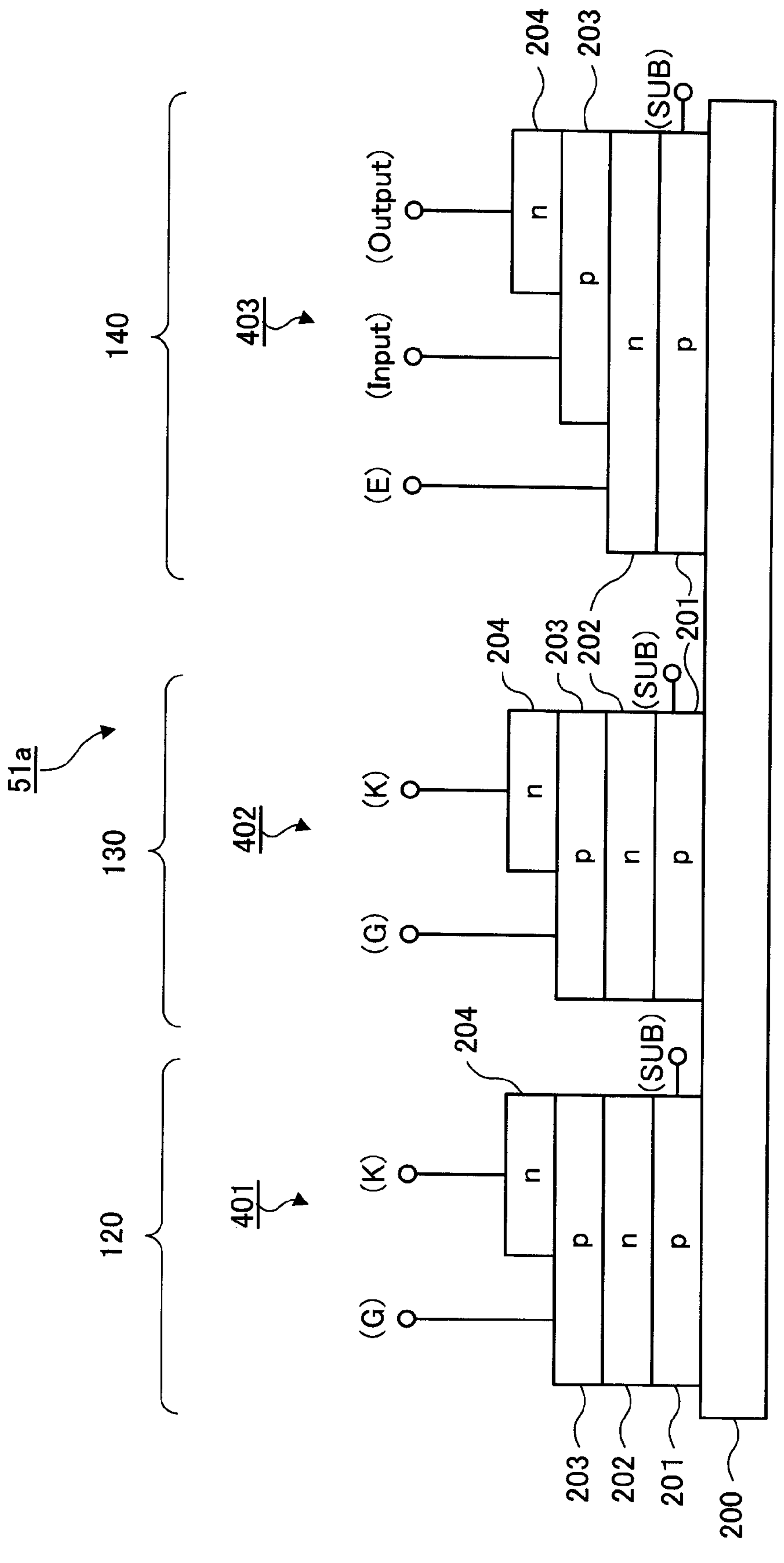
FIG. 7 shows a cross-sectional structure of a main portion of the light-emitting element chip according to the first exemplary embodiment.

FIG. 7 shows a cross-sectional structure of a main portion of the light-emitting element chip 51*a* according to the first exemplary embodiment. The light-emitting element chip 51*a* includes light-emitting thyristors 401, transfer thyristors 402 and logical operation elements 403 which are formed on a substrate 200 and each have a pnpn structure. The light-emitting thyristors 401 are the light-emitting thyristors $L_1$, $L_2$, $L_3$, . . . , of the light-emitting portion 120. The transfer thyristors 402 are the transfer thyristors $T_1$, $T_2$, $T_3$, . . . , of the setting portion 130. The logical operation elements 403 serve as the controller 140.

The light-emitting element chip 51*a* is formed of a GaAs-based semiconductor, and its first conductivity type is p-type, where holes are charge carriers, while its second conductivity type is n-type, where electrons are charge carriers. Specifically, the light-emitting element chip 51*a* is formed by: sequentially stacking, on the substrate 200, a p-type first semiconductor layer (abbreviated as p in the drawings) 201, an n-type second semiconductor layer (abbreviated as n in the drawings) 202, a p-type third semiconductor layer (abbreviated as p in the drawings) 203, an n-type fourth semiconductor layer (abbreviated as n in the drawings) 204; and thereafter etching predetermined portions. In the first exemplary embodiment, each of the light-emitting thyristors 401 in the light-emitting portion 120, the transfer thyristors 402 in the setting portion 130 and the logical operation elements 403 in the controller 140 has a layer structure in which the p-type first semiconductor layer 201, the n-type second semiconductor layer 202, the p-type third semiconductor layer 203 and the n-type fourth semiconductor layer 204 are vertically stacked.

Note that each of the connecting diodes $D_1$, $D_2$, $D_3$, . . . , used in the setting portion 130 is formed using a junction of the p-type third semiconductor layer 203 and the n-type fourth semiconductor layer 204.

Moreover, in the controller 140, not all but some of the logical operation elements 403 have pnpn structures. The controller 140 may use logical operation elements formed of some sequential layers. Such logical operation elements include: a pnp transistor formed of the p-type first semiconductor layer 201, the n-type second semiconductor layer 202 and the p-type third semiconductor layer 203; an npn transistor formed of the n-type second semiconductor layer 202, the p-type third semiconductor layer 203 and the n-type fourth semiconductor layer 204; a diode using a junction of the p-type first semiconductor layer 201 and the n-type second semiconductor layer 202; a diode using a junction of the n-type second semiconductor layer 202 and the p-type third semiconductor layer 203; and a diode using a junction of the p-type third semiconductor layer 203 and the n-type fourth semiconductor layer 204.

In the controller 140, the pnpn structure processed in a predetermined manner such as removing one or more upper semiconductor layers in some regions is used, as will be described later.

In the light-emitting thyristors 401 of the light-emitting portion 120 and the transfer thyristors 402 of the setting portion 130, the p-type first semiconductor layer 201 serving as anode electrodes (A), the n-type fourth semiconductor layer 204 and the p-type third semiconductor layer 203 are connected to a reference potential (SUB) electrode, a cathode electrode (K) and a gate electrode (G), respectively. On the other hand, in the logical operation elements 403 each having a pnpn structure of the controller 140, the p-type first semiconductor layer 201, the n-type second semiconductor layer 202, the p-type third semiconductor layer 203 and the n-type fourth semiconductor layer 204 are connected to the reference potential (SUB) electrode, a direct current voltage electrode (E), an input electrode (Input) and an output electrode (Output), respectively.

Each of the logical operation elements 403 of the controller 140 has a structure obtained by providing the direct current voltage electrode (E) to the n-type second semiconductor layer 202 of any one of the light-emitting thyristors 401 of the light-emitting portion 120 and the transfer thyristors 402 of the setting portion 130. Thus, by controlling an electronic potential of the direct current voltage electrode (E) of each logical operation element 403, the logical operation element 403 becomes either a light-emitting thyristor 401 of the light-emitting portion 120 or a transfer thyristor 402 of the setting portion 130.

In FIG. 7, the group of the light-emitting thyristors 401, the group of the transfer thyristors 402 and the group of the logical operation elements 403 are separated from one another like islands. However, these groups are not necessarily separated from one another in all the layers, but may be connected in some of the layers, as described later.

Moreover, the substrate 200 may be formed of a p-type semiconductor, and the p-type first semiconductor layer 201 may not be employed by causing the substrate 200 to also function as the p-type first semiconductor layer 201. In these cases, the reference potential (SUB) electrode may be provided to the back surface of the substrate 200.

Figure 8B:
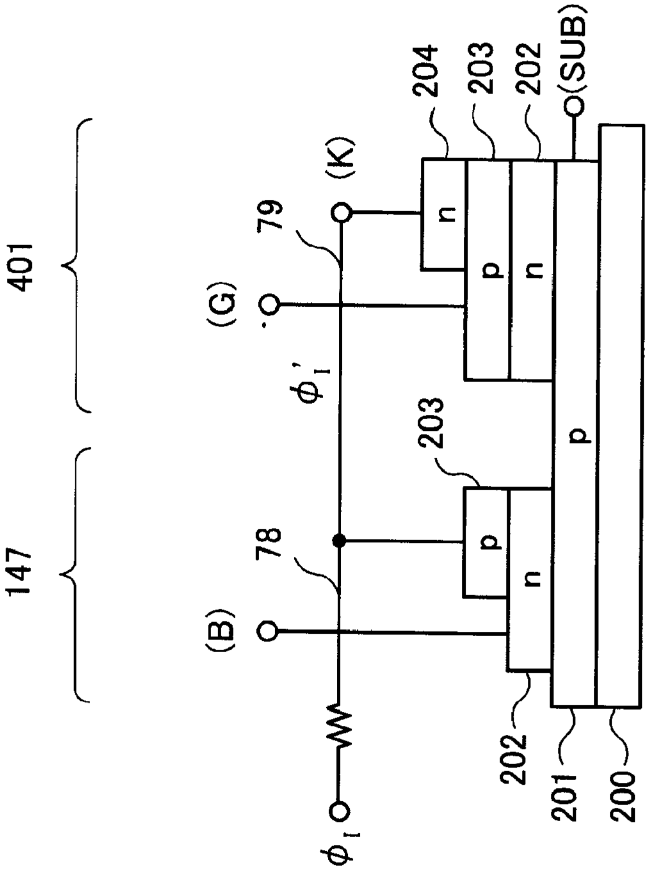
FIGS. 8A and 8B each show the chip selector, which is an example of the controller.
Figure 8A:
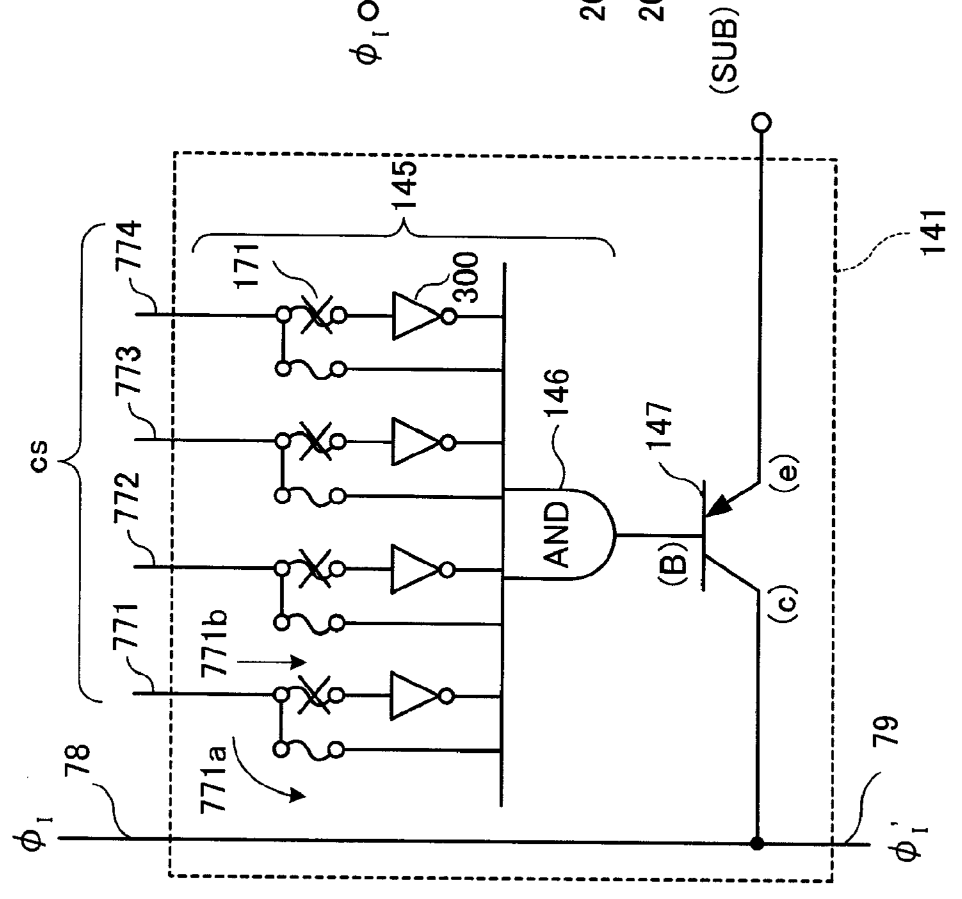

FIGS. 8A and 8B each show the chip selector 141, which is an example of the controller. Specifically, FIGS. 8A and 8B show an equivalent circuit and a cross-sectional structure of the chip selector 141, respectively.

The chip selector 141 is connected to four chip select signal (cs) lines 771 to 774, the input-side lighting signal ($\phi_I$) line 78, the output-side lighting signal ($\phi_I'$) line 79 and the reference potential (SUB) electrode. The chip selector 141 includes a decode circuit 145 and a transistor switch 147. The decode circuit 145 is formed of fuses 171, first NOT circuits 300 and a AND circuit 146. Each fuse 171 is used for connecting or disconnecting a current path. Each first NOT circuit 300 performs logical negation (NOT). The AND circuit 146 performs logical conjunction (AND). The chip select signal (cs) lines 771 to 774 are connected to the decode circuit 145 while an output terminal of the AND circuit 146 in the decode circuit 145 is connected to a base electrode (B) of the transistor switch 147. An emitter electrode (e) of the transistor switch 147 is connected to the reference potential (SUB) electrode while a collector electrode (c) of the transistor switch 147 is connected to the input-side lighting signal ($\phi$–) line 78 and the output-side lighting signal ($\phi_I'$) line.

The decode circuit 145 compares the unique identification information of the light-emitting element chip 51*a* with identification information inputted as the chip select signal cs by using logical operation. On the basis of a comparison result obtained from the logical operation of the decode circuit 145, the transistor switch 147 supplies the control signals for causing the light-emitting thyristors 401 to perform a light-emitting operation.

Firstly, a description will be given of the operation of the decode circuit 145. The chip select signal (cs) line 771 branches into paths 771*a* and 771*b* in the decode circuit 145. Only the fuse 171 is connected on the path 771*a* while the fuse 171 and the first NOT circuit 300 are connected in series on the path 771*b*. For example, suppose the case where the fuse 171 on the path 771*a*, which includes only the fuse 171, is set to be connected and where the fuse 171 on the path 771*b*, which includes the fuse 171 and the first NOT circuit 300 connected in series, is set to be disconnected. In this case, "1" is inputted to the AND circuit 146 when the chip select signal cs supplied through the chip select signal (cs) line 771 is "1," while "0" is inputted to the AND circuit 146 when the chip select signal cs supplied through the chip select signal (cs) line 771 is "0."

Suppose the contrary case where the fuse 171 on the path 771*a*, which includes only the fuse 171, is set to be disconnected and where the fuse 171 on the path 771*b*, which includes the fuse 171 and the first NOT circuit 300 connected in series, is set to be connected. In this case, when the chip select signal cs supplied through the chip select signal (cs) line 771 is "1,""0" is inputted to the AND circuit 146 since the first NOT circuit 300 outputs an inverted signal. On the other hand, "1" is inputted to the AND circuit 146 when the chip select signal cs supplied through the chip select signal (cs) line 771 is "0."

The same is true for the other chip select signal (cs) lines 772 to 774.

In FIG. 8A, the fuse 171 on the path 771*a*, which includes only the fuse 171, is set to be connected and the fuse 171 on the path 771*b*, which includes the fuse 171 and the first NOT circuit 300 connected in series, is set to be disconnected in each of the chip select signal (cs) lines 771 to 774. Accordingly, when all the chip select signals cs supplied through the respective chip select signal (cs) lines 771 to 774 are set to "1," that is, when the chip select signal cs is set to "1111," all the values inputted to the AND circuit 146 is "1." Only in this case, the AND circuit 146 outputs "1." On the other hand, when the chip select signal cs is not "1111," such as when the chip select signal cs is "0010," the AND circuit 146 outputs "0."

Here, the unique identification information of the light-emitting element chip 51*a* is formed of the connection or disconnection of the fuses 171, and compared with identification information inputted as the chip select signal cs from the outside.

Secondly, a description will be given of the transistor switch 147. The transistor switch 147 is a pnp transistor, and is connected to the H level of 0 V at the emitter electrode (e). When the AND circuit 146 outputs "1" (H level), the output of the transistor switch 147 is blocked. The lighting signal $\phi_I'$ corresponding to the input-side lighting signal $\phi_I$ is supplied to the cathode electrodes (K) of the light-emitting thyristors 401 of the light-emitting portion 120 through the input-side lighting signal ($\phi_I$) line 78 and then the output-side lighting signal ($\phi_I'$) line 79. According to this lighting signal $\phi_I'$, the light-emitting operation of the light-emitting thyristors 401 is controlled in the light-emitting element chip 51*a* on which this chip selector 141 is mounted.

On the other hand, when the AND circuit 146 outputs "0" (L level), the transistor switch 147 is turned on, and thus the lighting signal ($\phi_I'$) line 79 is fixed to the SUB of 0 V. In this case, the light-emitting thyristors 401 of the light-emitting element chip 51*a* on which this chip selector 141 is mounted emit no light, since the reference potential (SUB) electrode, which serves as the anode electrodes (A), and the cathode electrodes (K) have the same electronic potential of 0 V.

In this way, each chip selector 141 controls the light-emitting operation of the light-emitting element chip 51*a* on which the chip selector 141 is mounted.

Here, four signal lines are used for supplying the chip select signal cs. However, the number of such signal lines may be increased or reduced in accordance with the number of light-emitting element chips 51*a* on the light-emitting element head 100. Moreover, though each light-emitting element chip 51*a* is assigned its unique identification information by using the fuses 171 therein in the above example, the light-emitting element chip 51*a* may alternatively be assigned its unique identification information by forming a predetermined wiring pattern in manufacturing the light-emitting element chip 51.

FIG. 8B shows the cross-sectional structure of the transistor switch 147 and the light-emitting thyristors 401. The light-emitting thyristors 401 are the same as those illustrated in FIG. 7. The transistor switch 147 uses the p-type first semiconductor layer 201, the n-type second semiconductor layer 202 and the p-type third semiconductor layer 203 as an emitter region, a base region and a collector region, respectively. The light-emitting thyristors 401 and the transistor switch 147 are formed by: sequentially stacking, on the substrate 200, the p-type first semiconductor layer 201, the n-type second semiconductor layer 202, the p-type third semiconductor layer 203 and the n-type fourth semiconductor layer 204; and thereafter partially etching off predetermined layers. Here, the p-type first semiconductor layer 201 is shared by the transistor switch 147 and the light-emitting thyristors 401.

The gate electrodes (G) of the light-emitting thyristors 401 is connected to the gate electrodes (G) of the transfer thyristors 402 (not shown in the figure) while the base electrode (B) of the transistor switch 147 is connected to the output terminal of the AND circuit 146 (not shown in the figure).

Firstly, a first NOT circuit 300 as one of the logical operation elements 403 will be described.

Figure 9B:
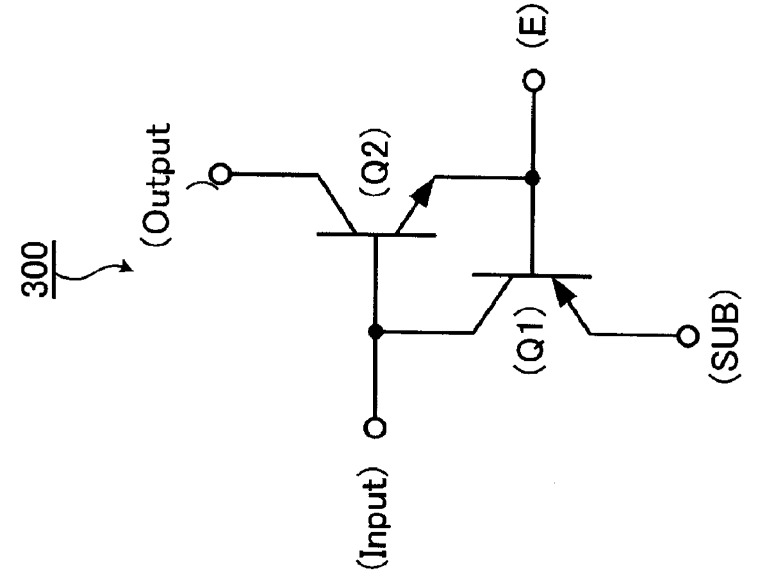
FIGS. 9A and 9B each show the first NOT circuit having a pnpn structure.
Figure 9A:
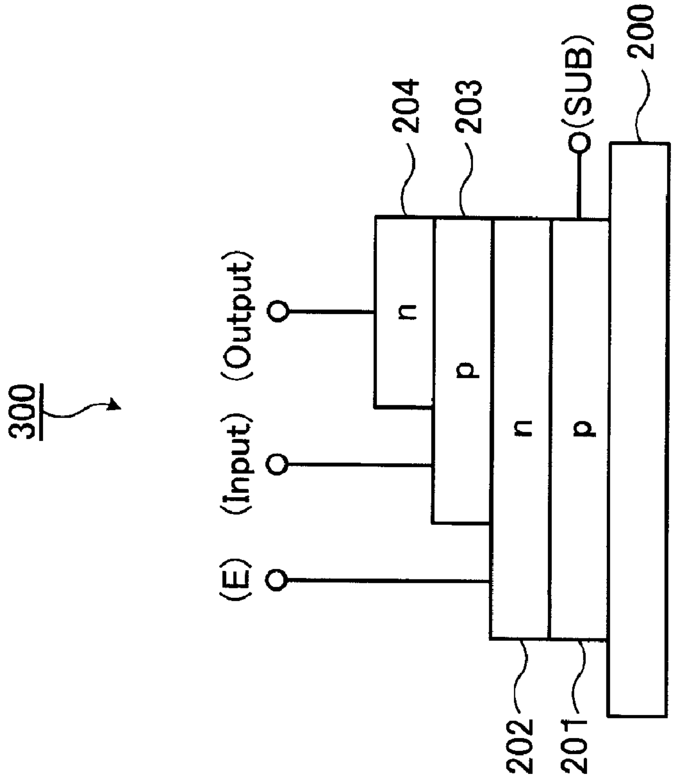

FIGS. 9A and 9B each show the first NOT circuit 300 having a pnpn structure. Specifically, FIGS. 9A and 9B show a cross-sectional structure and an equivalent circuit of the first NOT circuit 300, respectively.

As shown in FIG. 9A, the first NOT circuit 300 has the same structure as the logical operation element 403 shown in FIG. 7.

As shown in FIG. 9B, the first NOT circuit 300 is a circuit formed by combining a pnp transistor (Q1) and an npn transistor (Q2). In the pnp transistor (Q1), the p-type first semiconductor layer 201, the n-type second semiconductor layer 202 and the p-type third semiconductor layer 203 shown in FIG. 9A function as an emitter region, a base region and a collector region, respectively. In the npn transistor (Q2), the n-type second semiconductor layer 202, the p-type third semiconductor layer 203 and the n-type fourth semiconductor layer 204 shown in FIG. 9A function as an emitter region, a base region and a collector region, respectively. Note that the pnp transistor (Q1) and the npn transistor (Q2) are vertically stacked.

Hereinbelow, the operation of the first NOT circuit 300 will be described with reference to the equivalent circuit shown in FIG. 9B. Firstly, the reference potential (SUB) electrode is set to the H level of 0 V while the direct current voltage electrode (E) is set to the L level of −1 V to −1.5 V. In addition, a pn junction of the p-type first semiconductor layer 201 and the n-type second semiconductor layer 202 is forward biased. As a result, the pnp transistor (Q1) is turned on, and thus functions as a constant current source. In addition, the output electrode (Output) is pulled up to the H level through the load resistor (not shown in the figure). If the input electrode (Input) is the L level, a current flows from the reference potential (SUB) electrode to the input electrode (Input) through the pnp transistor (Q1). Since both the direct current voltage electrode (E) and the input electrode (Input) are the L level, the output of the npn transistor (Q2) is blocked, and thus the output electrode (Output) remains set to the H level.

On the other hand, if the input electrode (Input) is the H level, a current flows from the reference potential (SUB) electrode to the base region of the npn transistor (Q2) through the pnp transistor (Q1). As a result, the npn transistor (Q2) is turned on, and the electronic potential of the output electrode (Output) is fixed to that of the direct current voltage electrode (E) so that the output electrode (Output) becomes the L level. As described above, the first NOT circuit 300 functions as an NOT by setting the output electrode (Output) to the H level if the input electrode (Input) is the L level and by setting the output electrode (Output) to the L level if the input electrode (Input) is the H level.

This operation is the same as that of an integrated injection logic (IIL or $I^2L$), known as a logic operation element formed of a bipolar transistor, and thus based on the operation of a bipolar transistor.

Secondly, the AND circuit 146 will be described.

On the basis of the logical operation theory of A AND B=NOT (A) NOR NOT (B), the AND circuit 146 consists of a first NOT circuit 300 and a NOR circuit 310 that performs non-disjunction (NOR).

Hereinbelow, the NOR circuit 310 as one of the logical operation elements 403 will be described.

FIGS. 10A to 10C each show a NOR circuit 310 having a pnpn structure. Specifically, FIGS. 10A and 10B show a cross-sectional structure and an equivalent circuit of the NOR circuit 310, respectively. FIG. 10C is a truth table of the NOR circuit 310.

As shown in FIG. 10A, the NOR circuit 310 has a structure including two first NOT circuits 300 shown in FIG. 9A placed side by side. The p-type first semiconductor layer 201 and the n-type second semiconductor layer 202 are shared by these two first NOT circuits 300.

The input electrodes (Input) of the two side-by-side first NOT circuits 300 are connected to the first input electrode (Input 1) and the second input electrode (Input 2), respectively. In addition, the output electrode (Output), the direct current voltage electrode (E) and the reference potential (SUB) electrode are shared by these two first NOT circuits 300.

Hereinbelow, the operation of the NOR circuit 310 will be described with reference to the equivalent circuit shown in FIG. 10B. One of the two side-by-side first NOT circuits 300 serves as a pnp transistor (Q1) and an npn transistor (Q2) while the other serves as a pnp transistor (Q3) and an npn transistor (Q4). Relations between the pnp and npn transistors (Q1) to (Q4) and the semiconductor layers 201 to 204 are as described with reference to FIG. 9B. Firstly, the reference potential (SUB) electrode is set to the H level of 0 V while the direct current voltage electrode (E) is set to the L level of −1 V to −1.5 V. In addition, the output electrode (Output) is pulled up to the H level through the load resistor (not shown in the figure). If the first input electrode (Input 1) is the L level, a current flows from the reference potential (SUB) electrode to the first input electrode (Input 1) through the pnp transistor (Q1). Since the first input electrode (Input 1) is the L level, the output of the npn transistor (Q2) is blocked. If the second input electrode (Input 2) is also the L level, the output of the npn transistor (Q4) is blocked. Accordingly, the output electrode (Output) remains set to the H level.

On the other hand, if the first input electrode (Input 1) is the H level, a current flows from the reference potential (SUB) electrode to the base region of the npn transistor (Q2) through the pnp transistor (Q1). As a result, the npn transistor (Q2) is turned on, and the electronic potential of the output electrode (Output) is fixed to that of the direct current voltage electrode (E) so that the output electrode (Output) becomes the L level.

If the second input electrode (Input 2) is L level, the npn transistor (Q4) is turned on. Thus, the output electrode (Output) is L level. In other words, if either the first input electrode (Input 1) or the second input electrode (Input 2) is the H level, the npn transistor (Q2) or (Q4) is turned on, and thus the output electrode (Output) is fixed to the L level. Thus, the NOR circuit 310 functions as a NOR shown in the truth table of the FIG. 10C.

FIGS. 10A to 10C each show a two-input NOR circuit 310 including two first NOT circuits 300 placed side by side. The NOR circuit 310 may be multi-input NOR circuit including multiple first NOT circuits 300 placed side by side.

As described above, the foregoing AND circuit 146 may be formed of the first NOT circuits 300 according to the first exemplary embodiment, and the NOR circuit 310. Moreover, combination of the NOR circuits 310 allows implementation of various logical operations.

Note that, in the first exemplary embodiment, the light-emitting thyristors 401 of the light-emitting portion 120 and the transfer thyristors 402 of the setting portion 130 uses −3.3 V as the power supply $V_{GA}$ while the logical operation elements 403 of the controller 140 uses −1 to −1.5 V as a voltage set to the direct current voltage electrode (E). The voltage difference among the light-emitting portion 120, the setting portion 130 and the controller 140 is changeable by interposing a transistor switch or the like therebetween.

Figure 11B:
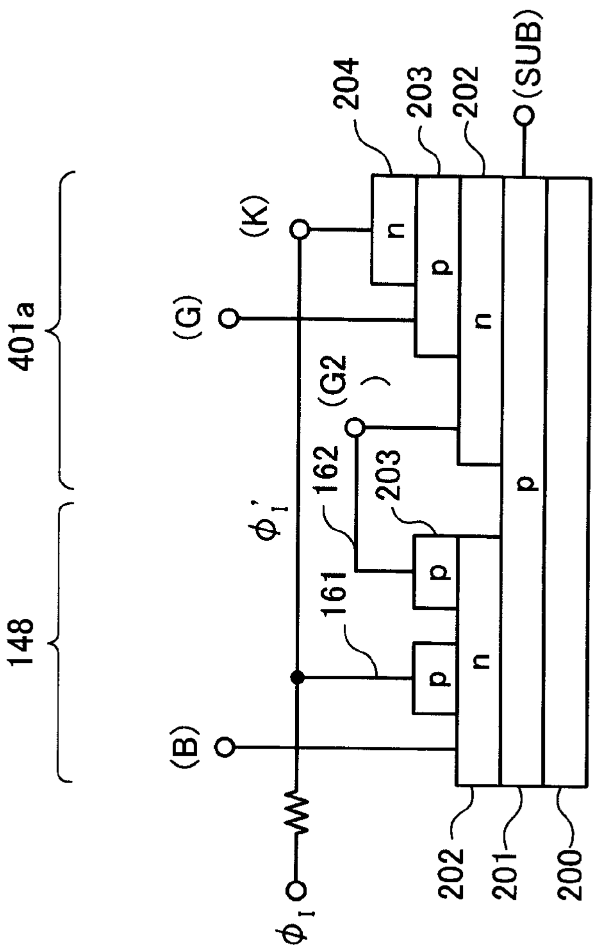
FIGS. 11A and 11B each show a chip selector, which is another example of the controller.
Figure 11A:
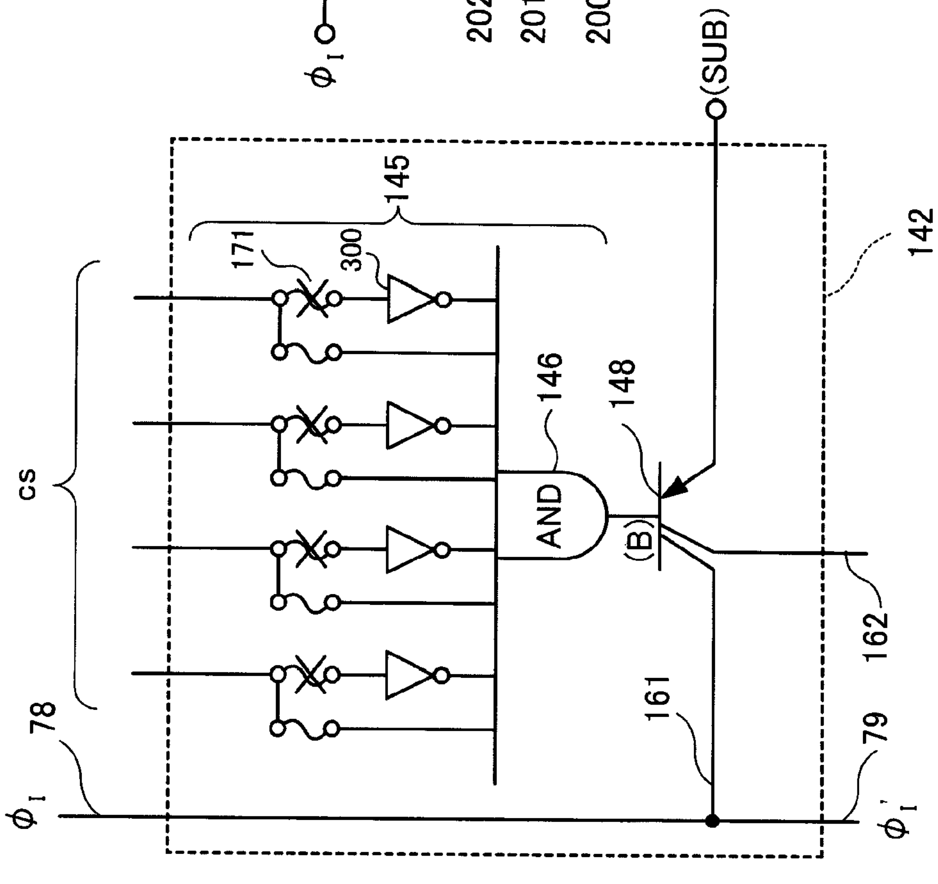

FIGS. 11A and 11B each show a chip selector 142, which is another example of the controller. Specifically, FIGS. 11A and 11B show an equivalent circuit and a cross-sectional structure of the chip selector 142, respectively.

The chip selector 142 shown in FIGS. 11A and 11B is different from the chip selector 141 shown in FIGS. 8A and 8B because a transistor switch 148 has a multicollector electrode structure. In the multicollector electrode structure, the bipolar transistors each have multiple collector electrodes. In this example, a first collector electrode 161 is connected to the input-side lighting signal ($\phi_I$) line 78 and the output-side lighting signal ($\phi_I'$) line 79, while a second collector electrode 162 is connected to a second gate electrode (G2). The second gate electrode (G2) is provided to the n-type second semiconductor layer 202 for all light-emitting thyristors 401*a* in the light-emitting portion 120.

Hereinbelow, the operation of the chip selector 142 will be described with reference to the equivalent circuit shown in FIG. 11A. When the chip select signal cs is set to “1111,” the AND circuit 146 outputs “1” (H level). This blocks the output of the transistor switch 148, and thus the lighting signal $\phi_I'$ corresponding to the input-side lighting signal $\phi_I$ is supplied to the light-emitting portion 120 of the light-emitting element chip 51*a* through the input-side lighting signal ($\phi_I$) line 78 and then the output-side lighting signal ($\phi_I'$) line 79. Here, since the output of the transistor switch 148 is blocked, the second collector electrode 162 has a high impedance, and thus does not prevent the light-emitting thyristor 401*a* from emitting light.

On the other hand, when the chip select signal cs is not “1111,” the AND circuit 146 outputs “0” (L level). Accordingly, the transistor switch 148 is turned on, and the first and second collector electrodes 161 and 162 are set to the SUB of 0 V. As a result, the output-side lighting signal ($\phi_I'$) line 79 is fixed to the SUB of 0 V, and thus the chip selector 142 supplies no lighting signal $\phi_I'$ to the light-emitting thyristors 401*a*. The reference potential (SUB) electrode serving as the anode electrodes (A) of the light-emitting thyristors 401*a*, the second gate electrode (G2) and the cathode electrodes (K) are all set to 0 V since the second collector electrode 162 is connected to the second gate electrode (G2) of the light-emitting thyristors 401*a*. This prevents the light-emitting thyristors 401*a* from operating.

As described above, each chip selector 142 has a function of performing the following operations when judging that the light-emitting element chip 51*a* on which the chip selector 142 is mounted is not selected: supplying no lighting signal $\phi_I'$ to the light-emitting thyristors 401*a;* and preventing the light-emitting thyristors 401*a* from malfunctioning to emit light.

Figure 12:
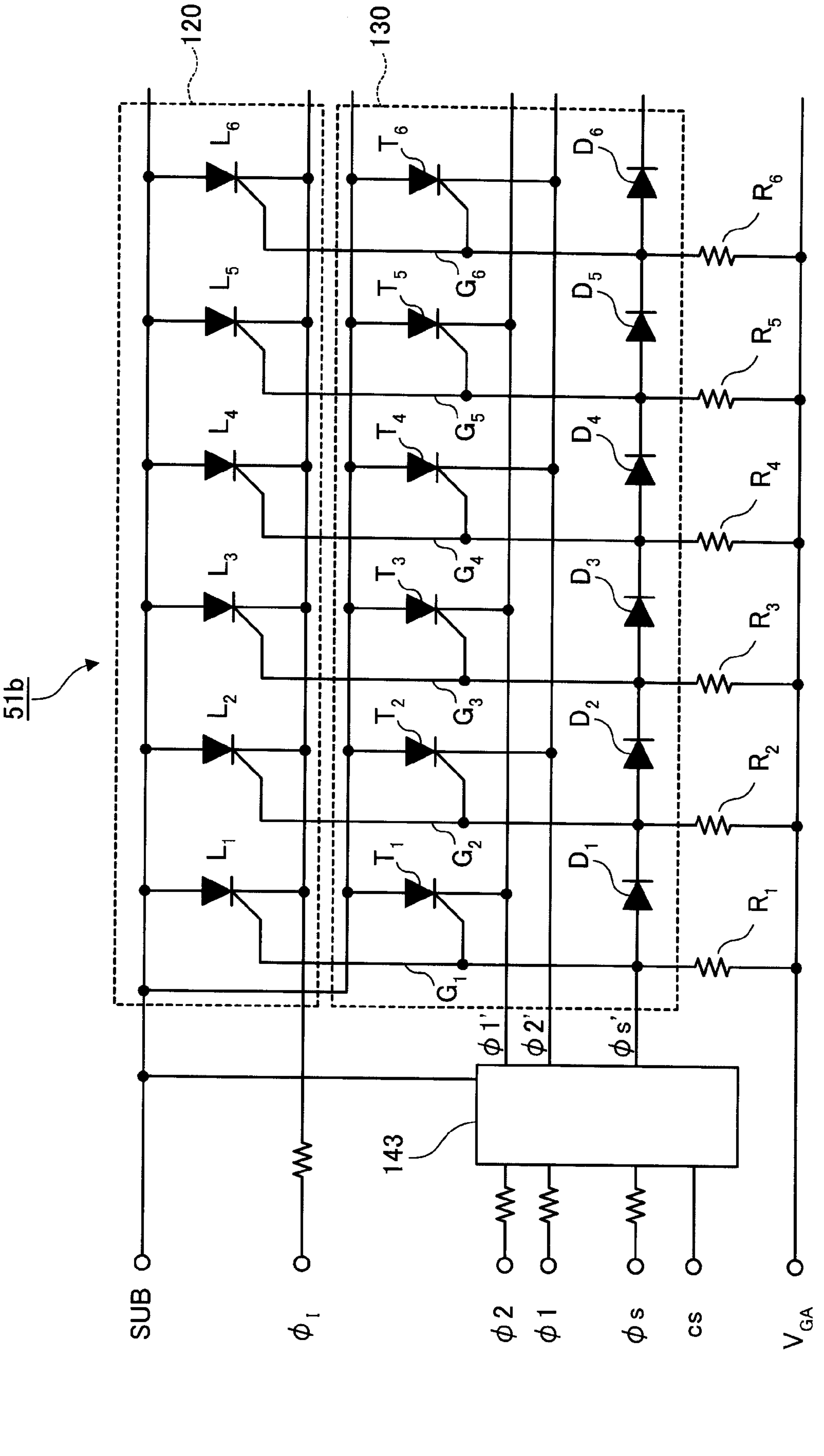
FIG. 12 is a diagram for illustrating a chip selector, which is still another example of the controller.

FIG. 12 is a diagram for illustrating a chip selector 143, which is still another example of the controller. The chip selector 141 shown in FIGS. 8A and 8B and the chip selector 142 shown in FIGS. 11A and 11B each control the lighting signal $\phi_I$. By contrast, the chip selector 143 controls the clock signals ϕ1 and ϕ2 and the start signal ϕs. When each chip selector 143 judges, on the basis of the chip select signal cs, that a light-emitting element chip 51*b* on which the chip selector 143 is mounted is selected, the input-side clock signals ϕ1 and ϕ2 and the input-side start signal ϕs are supplied to the setting portion 130 as the output-side clock signals ϕ1' and ϕ2' and the output-side start signal ϕs', respectively. On the other hand, when each chip selector 143 judges that the light-emitting element chip 51*b* on which the chip selector 143 is mounted is not selected, the clock signals ϕ1' and ϕ2' and the start signal ϕs' are caused to have an fixed electronic potential, such as 0 V, and thereby the setting portion 130 is prevented from operating.

Next, a description will be given of a second exemplary embodiment of the light-emitting element chip 51. In the first exemplary embodiment shown in FIG. 6, employed are the light-emitting thyristors and the transfer thyristors in each of which the anode electrode is set as the reference potential (SUB) electrode. However, even if light-emitting thyristors and transfer thyristors in each of which the cathode electrode is set as the reference potential (SUB) electrode are employed, the light-emitting element chip 51 is allowed to operate by changing polarities of the circuit therein.

Figure 13:
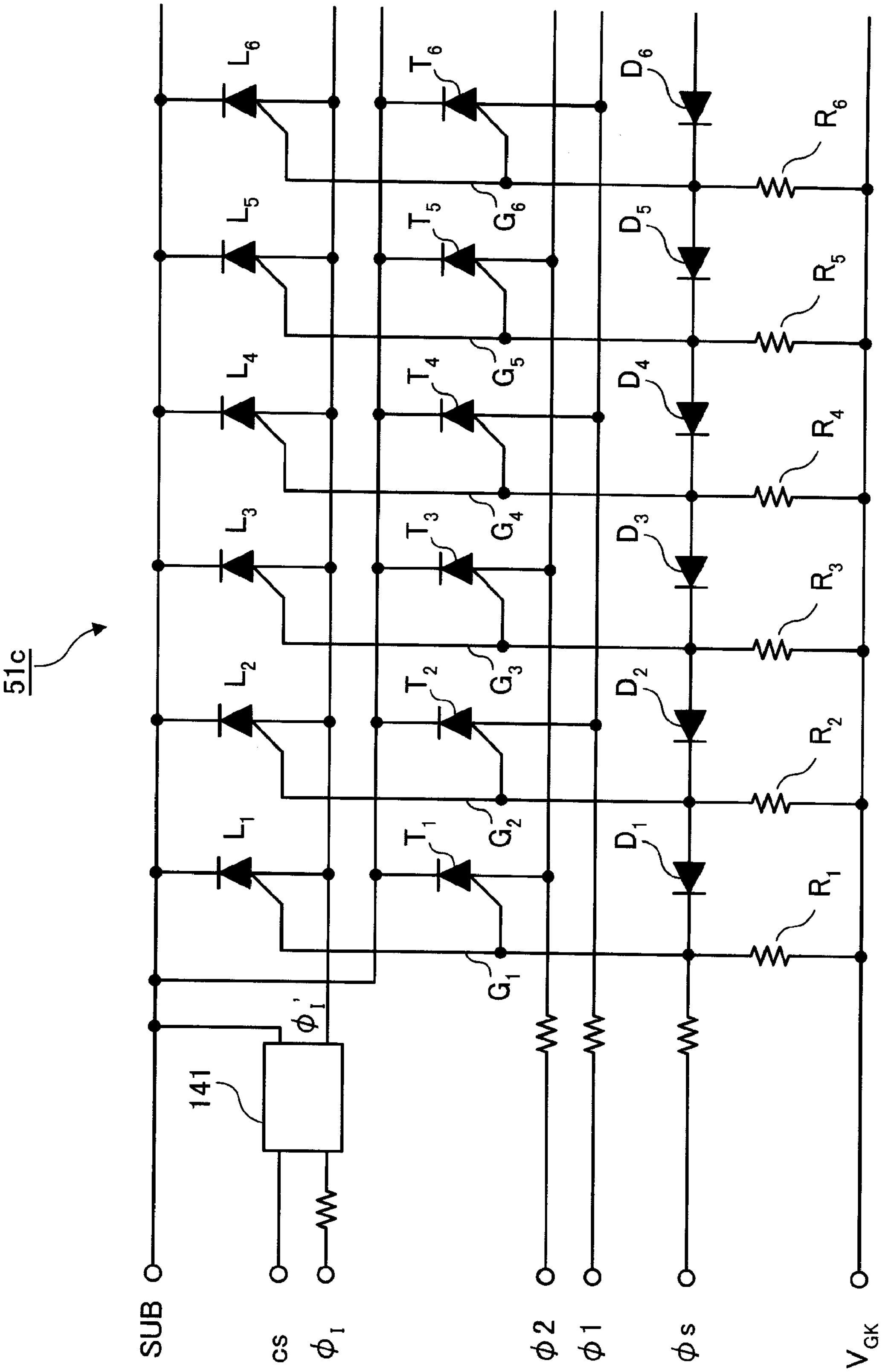
FIG. 13 shows an equivalent circuit of a light-emitting element chip using a self-scanning light-emitting element array of the second exemplary embodiment.

FIG. 13 shows an equivalent circuit of a light-emitting element chip 51*c* using a self-scanning light-emitting element array of the second exemplary embodiment. The light-emitting element chip 51*c* uses a self-scanning light-emitting element array that includes a light-emitting portion and a setting portion separated from each other. The detail description thereof will be omitted here. However, briefly, the light-emitting element chip 51*c* is allowed to operate by changing the power supply $V_{GA}$ to a power supply $V_{GK}$ and changing polarities of the circuit therein.

Figure 14:
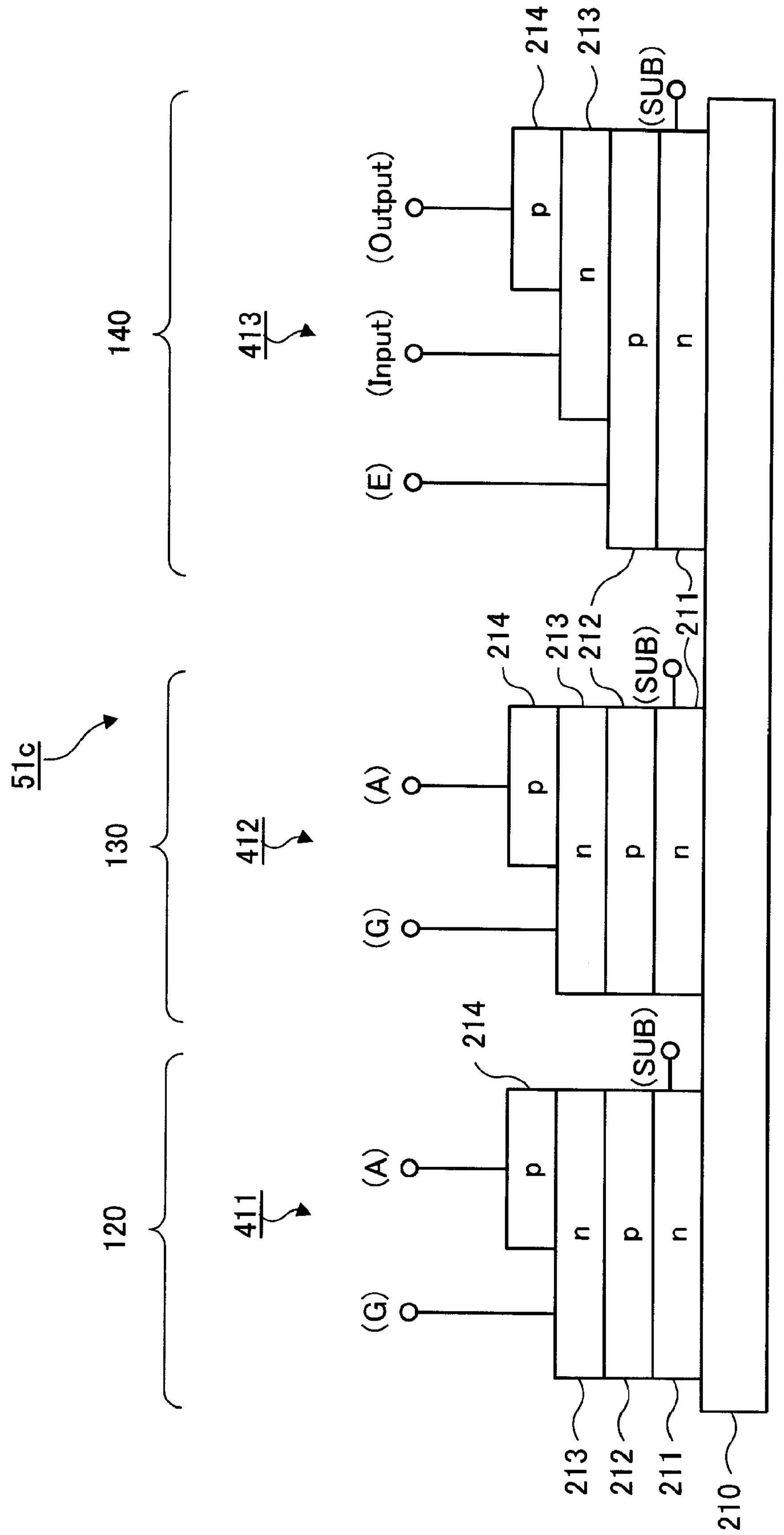
FIG. 14 shows a cross-sectional structure of a main portion of the light-emitting element chip according to the second exemplary embodiment.

FIG. 14 shows a cross-sectional structure of a main portion of the light-emitting element chip 51*c* according to the second exemplary embodiment. The light-emitting element chip 51*c* includes light-emitting thyristors 411, transfer thyristors 412 and logical operation elements 413 of the controller 140 which are formed on a substrate 210 and each have a npnp structure. The light-emitting thyristors 411 are the light-emitting thyristors $L_1$, $L_2$, $L_3$, . . . , of the light-emitting portion 120. The transfer thyristors 412 are the transfer thyristors $T_1$, $T_2$, $T_3$, . . . , of the setting portion 130.

The light-emitting element chip 51*c* is formed of a GaAs-based semiconductor, and its first conductivity type is n-type, where electrons are charge carriers, while its second conductivity type is p-type, where holes are charge carriers. Specifically, the light-emitting element chip 51*c* is formed by: sequentially stacking, on the substrate 210, an n-type first semiconductor layer 211, a p-type second semiconductor layer 212, an n-type third semiconductor layer 213, a p-type fourth semiconductor layer 214; and thereafter etching predetermined portions. In the second exemplary embodiment, each of the light-emitting thyristors 411 in the light-emitting portion 120, the transfer thyristors 412 in the setting portion 130 and the logical operation elements 413 in the controller 140 has a layer structure in which the n-type first semiconductor layer 211, the p-type second semiconductor layer 212, the n-type third semiconductor layer 213 and the p-type fourth semiconductor layer 214 are vertically stacked.

Note that each of the connecting diodes used in the setting portion 130 is formed using a junction of the n-type third semiconductor layer 213 and the p-type fourth semiconductor layer 214.

Moreover, in the controller 140, not all but some of the logical operation elements 413 have npnp structures. The controller 140 may use logical operation elements formed of some sequential layers. Such logical operation elements include: an npn transistor formed of the n-type first semiconductor layer 211, the p-type second semiconductor layer 212 and the n-type third semiconductor layer 213; a pnp transistor formed of the p-type second semiconductor layer 212, the n-type third semiconductor layer 213 and the p-type fourth semiconductor layer 214; a diode using a junction of the n-type first semiconductor layer 211 and the p-type second semiconductor layer 212; a diode using a junction of the p-type second semiconductor layer 212 and the n-type third semiconductor layer 213; and a diode using a junction of the n-type third semiconductor layer 213 and the p-type fourth semiconductor layer 214.

In the controller 140, the npnp structure processed in a predetermined manner such as removing one or more upper semiconductor layers in some regions is used, as will be described later.

In the light-emitting thyristors 411 of the light-emitting portion 120 and the transfer thyristors 412 of the setting portion 130, the n-type first semiconductor layer 211 serving as cathode electrodes (K) (not shown in the figure), the p-type fourth semiconductor layer 214 and the n-type third semiconductor layer 213 are connected to a reference potential (SUB) electrode, an anode electrode (A) and a gate electrode (G), respectively. On the other hand, in the logical operation elements 413 of the controller 140, the n-type first semiconductor layer 211, the p-type second semiconductor layer 212, the n-type third semiconductor layer 213 and the p-type fourth semiconductor layer 214 are connected to the reference potential (SUB) electrode, a direct current voltage electrode (E), an input electrode (Input) and an output electrode (Output), respectively.

Note that, each of the logical operation elements 413 has a structure obtained by providing the direct current voltage electrode (E) to the p-type second semiconductor layer 212 of any one of the light-emitting thyristors 411 and the transfer thyristors 412. Thus, by controlling an electronic potential of the direct current voltage electrode (E) of each logical operation element 413, the logical operation element 413 becomes either a light-emitting thyristor 411 of the light-emitting portion 120 or a transfer thyristor 412 of the setting portion 130.

In FIG. 14, the group of the light-emitting thyristors 411, the group of the transfer thyristors 412 and the group of the logical operation elements 413 are separated from one another like islands. However, these groups are not necessarily separated from one another in all the layers, but may be connected in some of the layers, as described later.

Moreover, the substrate 210 may be formed of an n-type semiconductor, and the n-type first semiconductor layer 211 may not be employed by causing the substrate 210 to also function as the n-type first semiconductor layer 211. In these cases, the reference potential (SUB) electrode may be provided to the back surface of the substrate 210.

Figure 15B:
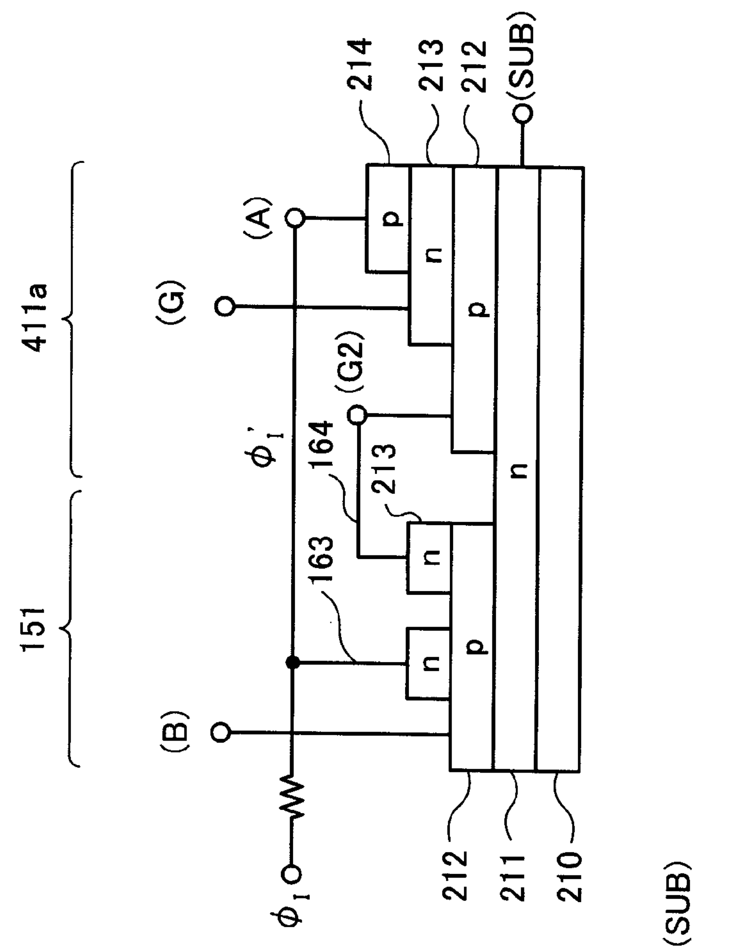
FIGS. 15A and 15B each show a chip selector according to the second exemplary embodiment, which is another example of the controller.
Figure 15A:
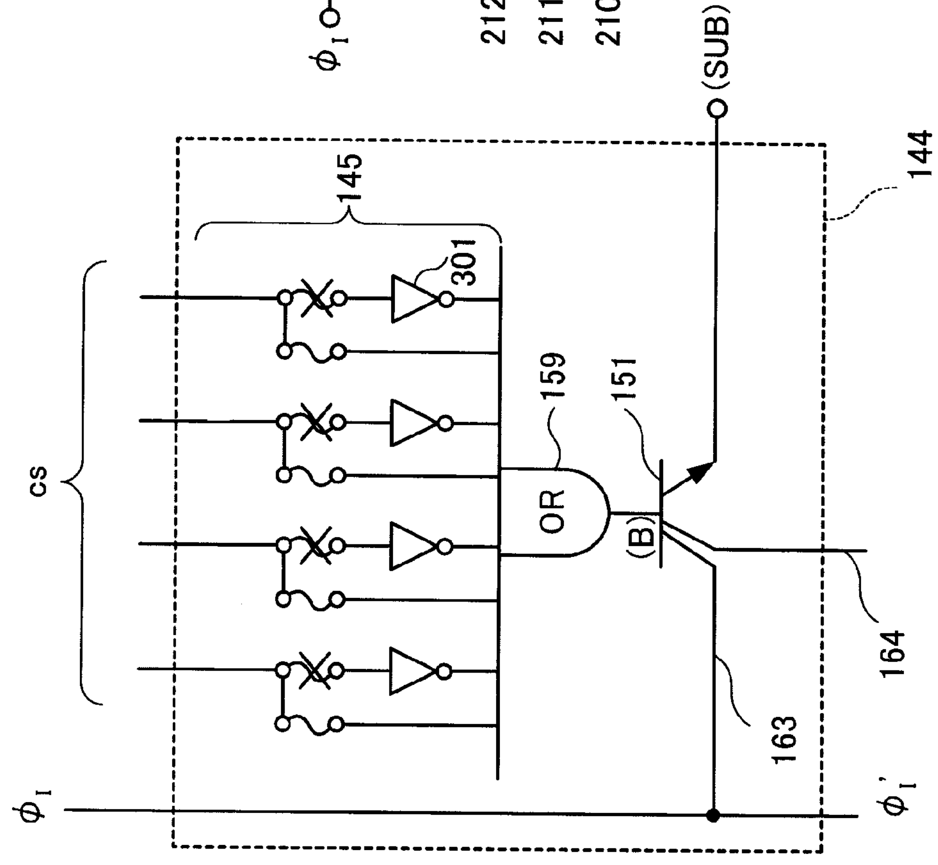

FIGS. 15A and 15B each show a chip selector 144 according to the second exemplary embodiment, which is another example of the controller. A transistor switch 151 of the chip selector 144 has a multicollector electrode structure, and includes a first collector electrode 163 and a second collector electrode 164. The second collector electrode 164 is connected to second gate electrodes (G2) respectively of all light-emitting thyristors 411*a* in the light-emitting portion 120.

The detail description thereof will be omitted. However, briefly, the chip selector 144 is allowed to operate by: including an OR circuit 159 and second NOT circuits 301 in place of the AND circuit 146 and the first NOT circuits 300 of the chip selector 142; reversing the polarities of the transistor switches 151; and changing polarities of the circuit therein.

Firstly, the second NOT circuit 301 as one of the logical operation elements will be described.

Figure 16B:
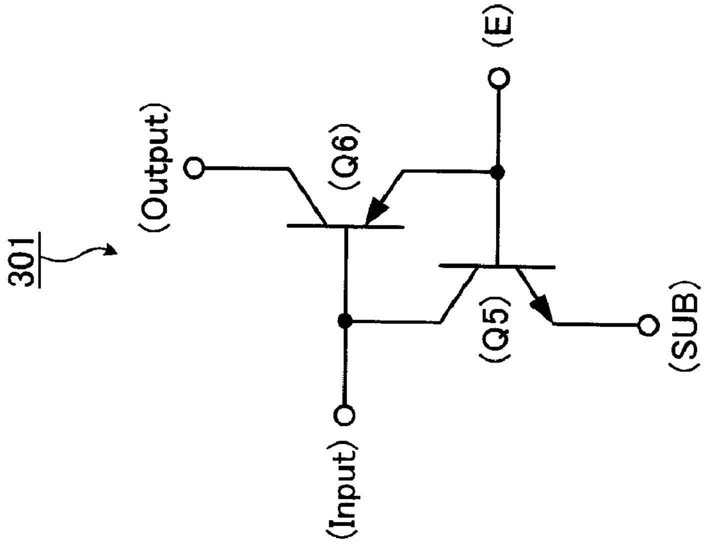
FIGS. 16A and 16B each show the second NOT circuit having an npnp structure.
Figure 16A:
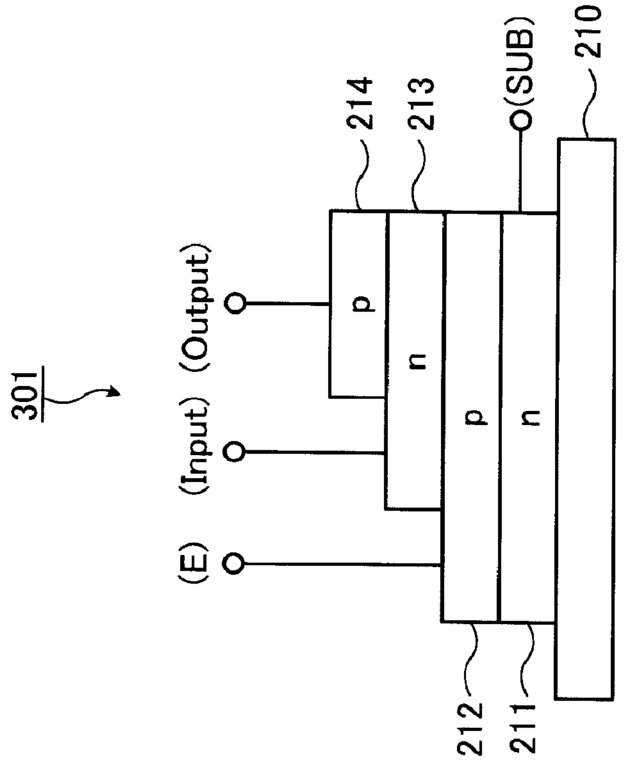

FIGS. 16A and 16B each show the second NOT circuit 301 having an npnp structure. Specifically, FIGS. 16A and 16B show a cross-sectional structure and an equivalent circuit of the second NOT circuit 301, respectively.

As shown in FIG. 16A, the second NOT circuit 301 has the same structure as the logical operation element 413 shown in FIG. 14.

As shown in FIG. 16B, the second NOT circuit 301 is a circuit formed by combining an npn transistor (Q5) and a pnp transistor (Q6). In the npn transistor (Q5), the n-type first semiconductor layer 211, the p-type second semiconductor layer 212 and the n-type third semiconductor layer 213 shown in FIG. 16A function as an emitter region, a base region and a collector region, respectively. In the pnp transistor (Q6), the p-type second semiconductor layer 212, the n-type third semiconductor layer 213 and the p-type fourth semiconductor layer 214 shown in FIG. 16A function as an emitter region, a base region and a collector region, respectively. Note that the npn transistor (Q5) and the pnp transistor (Q6) are vertically stacked.

Hereinbelow, the operation of the second NOT circuit 301 will be described with reference to the equivalent circuit shown in FIG. 16B. Firstly, the reference potential (SUB) electrode is set to the L level of 0 V while the direct current voltage electrode (E) is set to the H level of 1 V to 1.5 V. In addition, a junction of the n-type first semiconductor layer 211 and the p-type second semiconductor layer 212 is forward biased. As a result, the npn transistor (Q5) is turned on, and thus functions as a constant current source. In addition, the output electrode (Output) is pulled down to the L level through the load resistor (not shown in the figure) If the input electrode (Input) is the H level, a current flows from the input electrode (Input) to the reference potential (SUB) electrode through the npn transistor (Q5). Since both the direct current voltage electrode (E) and the input electrode (Input) are the H level, the output of the pnp transistor (Q6) is blocked, and thus the output electrode (Output) remains set to the L level. On the other hand, if the input electrode (Input) is the L level, a current flows from the base region of the pnp transistor (Q6) to the reference potential (SUB) electrode through the npn transistor (Q5). As a result, the pnp transistor (Q6) is turned on, and the electronic potential of the output electrode (Output) is fixed to that of the direct current voltage electrode (E) so that the output electrode (Output) becomes the H level. As described above, the second NOT circuit 301 functions as an NOT by setting the output electrode (Output) to the H level if the input electrode (Input) is the L level and by setting the output electrode (Output) to the L level if the input electrode (Input) is the H level.

Secondly, the OR circuit 159 will be described.

On the basis of A OR B=NOT (A) NAND NOT (B), the OR circuit 159 consists of a second NOT circuit 301 and a NAND circuit 311 that performs inverted AND (NAND) operation.

Hereinbelow, the NAND circuit 311 as one of the logical operation elements 413 will be described.

FIGS. 17A to 17C each show a NAND circuit 311 having an npnp structure. Specifically, FIGS. 17A and 17B show a cross-sectional structure and an equivalent circuit of the NAND circuit 311, respectively. FIG. 17C is a truth table of the NAND circuit 311.

As shown in FIG. 17A, the NAND circuit 311 has a structure including two second NOT circuits 301 shown in FIG. 16A placed side by side. The n-type first semiconductor layer 211 and the p-type second semiconductor layer 212 are shared by these two second NOT circuits 301.

The input electrodes (Input) of the two side-by-side second NOT circuits 301 are connected to the third input electrode (Input 3) and the fourth input electrode (Input 4), respectively. In addition, the output electrode (Output), the direct current voltage electrode (E) and the reference potential (SUB) electrode are shared by these two second NOT circuits 301.

Hereinbelow, the operation of the NAND circuit 311 will be described with reference to the equivalent circuit shown in FIG. 17B. One of the two side-by-side second NOT circuits 301 serves as an npn transistor (Q5) and a pnp transistor (Q6) while the other serves as an npn transistor (Q7) and a pnp transistor (Q8).

Relations between the npn and pnp transistors (Q5) to (Q8) and the semiconductor layers 211 to 214 are as described with reference to FIG. 16B. Firstly, the reference potential (SUB) electrode is set to the L level of 0 V while the direct current voltage electrode (E) is set to the H level of 1 V to 1.5 V. In addition, the output electrode (Output) is pulled down to the L level through the load resistor (not shown in the figure). If the third input electrode (Input 3) is the H level, a current flows from the third input electrode (Input 3) to the reference potential (SUB) electrode through the npn transistor (Q5). Since the third input electrode (Input 3) is the H level, the output of the pnp transistor (Q6) is blocked. If the fourth input electrode (Input 4) is also the H level, the output of the pnp transistor (Q8) is blocked. Accordingly, the output electrode (Output) remains set to the L level.

On the other hand, if the third input electrode (Input 3) is the L level, a current flows from the base of the pnp transistor (Q6) to the reference potential (SUB) electrode through the npn transistor (Q5). As a result, the pnp transistor (Q6) is turned on, and the electronic potential of the output electrode (Output) is fixed to that of the direct current voltage electrode (E) so that the output electrode (Output) becomes the H level. If the fourth input electrode (Input 4) is H level, the output electrode (Output) becomes the H level. In other words, if either the third input electrode (Input 3) or the fourth input electrode (Input 4) is the L level, the pnp transistor (Q6) or (Q8) is turned on, and thus the output electrode (Output) is fixed to the H level. Thus, the NAND circuit 311 functions as a NAND shown in the truth table of the FIG. 17C.

FIGS. 17A to 17C each show a two-input NAND circuit 311 including two second NOT circuits 301 placed side by side. The NAND circuit 311 maybe multi-input NAND circuit including multiple second NOT circuits 301 placed side by side.

As described above, the foregoing OR circuit 159 may be formed of the second NOT circuits 301 according to the second exemplary embodiment, and the NAND circuit 311. Moreover, combination of the NAND circuits 311 allows implementation of various logical operations.

Note that, in the second exemplary embodiment, the light-emitting thyristors 411 of the light-emitting portion 120 and the transfer thyristors 412 of the setting portion 130 uses 3.3 V as the power supply $V_{GK}$ while the logical operation elements 413 of the controller 140 uses 1 to 1.5 V as a voltage set to the direct current voltage electrode (E). The voltage difference among the light-emitting portion 120, the setting portion 130 and the controller 140 is changeable by interposing a transistor switch or the like therebetween.

Moreover, on the basis of the logical operation theories, an RS flip flop, a D latch, a D flip flop and a shift register may be configured by using NOR circuits or NAND circuits.

Thus, though description has been given of the case of using a chip selector as the controller in the foregoing exemplary embodiments, the present invention is not limited to this. Alternatively, a shift circuit may be employed which shifts light-emitting positions at the start of a light-emitting operation.

Moreover, the light-emitting element chips are formed of a GaAs-based semiconductor, but the material of the light-emitting element chips is not limited to this. For example, the light-emitting element chips may be formed of another composite semiconductor difficult to turn into a p-type semiconductor or an n-type semiconductor by ion implantation, such as GaP.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting element chip, comprising:

a substrate;

a light-emitting portion including a plurality of light-emitting elements each having

- a first semiconductor layer that has a first conductivity type and that is stacked on the substrate,
- a second semiconductor layer that has a second conductivity type and that is stacked on the first semiconductor layer, the second conductivity type being a conductivity type different from the first conductivity type,
- a third semiconductor layer that has the first conductivity type and that is stacked on the second semiconductor layer, and
- a fourth semiconductor layer that has the second conductivity type and that is stacked on the third semiconductor layer;
- a setting portion including a plurality of setting elements, the setting elements being respectively provided corresponding to the plurality of light-emitting elements, the setting elements each making the corresponding one of the light-emitting elements ready to emit light when the setting elements are turned on, and the setting elements each having the first semiconductor layer stacked on the substrate, the second semiconductor layer stacked on the first semiconductor layer, the third semiconductor layer stacked on the second semiconductor layer and the fourth semiconductor layer stacked on the third semiconductor layer; and a controller including a logical operation element that performs logical operation for causing the plurality of light-emitting elements of the light-emitting portion to perform a light-emitting operation, the logical operation element being formed by combining some sequential layers of the first semiconductor layer stacked on the substrate, the second semiconductor layer stacked on the first semiconductor layer, the third semiconductor layer stacked on the second semiconductor layer, and the fourth semiconductor layer stacked on the third semiconductor layer, wherein the controller includes, as the logical operation element, a NOT circuit including:

an input electrode to which a signal is inputted;

an output electrode from which a logical operation result is outputted;

a reference potential electrode set to have a reference potential; and a direct current voltage electrode that supplies a direct current voltage for forward biasing a junction of the first semiconductor layer and the second semiconductor layer, the first semiconductor layer is connected to the reference potential electrode, the second semiconductor layer is connected to the direct current voltage electrode, the third semiconductor layer is connected to the input electrode, and the fourth semiconductor layer is connected to the output electrode.

2. The light-emitting element chip according to claim 1, wherein when the first conductivity type is p-type, where holes are charge carriers, and when the second conductivity type is n-type, where electrons are charge carriers, the controller includes, as the logical operation element, a NOR circuit formed of a plurality of the NOT circuits sharing the reference potential electrode, the direct current voltage electrode and-the output electrode, the NOR circuit receiving plurality of signals through plurality of the input electrodes, respectively.

3. The light-emitting element chips according to claim 2, wherein the controller of each of the light-emitting element chips includes a logical operation circuit formed of the NOT circuit and the NOR circuit and compares, by using the logical operation circuit, unique identification information assigned,to each of the light-emitting element chips with identification information inputted from outside, and if the unique identification information matches the information inputted from outside, the controller supplies a control signal to the light-emitting portion and the setting portion, the control signal causing the plurality of light-emitting elements included in the light-emitting portion to emit light.

4. The light-emitting element chip according to claim 1, wherein when the first conductivity type is n-type, where electrons are charge carriers, and when the second conductivity type is p-type, where holes are charge carriers, the controller includes, as the logical operation element, a NAND circuit formed of a plurality of the NOT circuits sharing the reference potential electrode, the direct current voltage electrode and the output electrode, the NAND circuit receiving a plurality of signals through a plurality of the input electrodes, respectively.

5. The light-emitting element chip according to claim 1, wherein the first semiconductor layer, the second semiconductor layer, the third semiconductor layer and the fourth semiconductor layer are formed of a composite semiconductor.

* * * * *